(12) United States Patent
Takahashi

(10) Patent No.: US 7,436,589 B2
(45) Date of Patent: Oct. 14, 2008

(54) REFLECTIVE-TYPE PROJECTION OPTICAL SYSTEM AND EXPOSURE APPARATUS EQUIPPED WITH SAID REFLECTIVE-TYPE PROJECTION OPTICAL SYSTEM

(75) Inventor: Tomowaki Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/266,201

(22) Filed: Nov. 4, 2005

(65) Prior Publication Data

US 2006/0098273 A1 May 11, 2006

(30) Foreign Application Priority Data

Nov. 5, 2004 (JP) ............................. 2004-322282

(51) Int. Cl.
*G02B 17/00* (2006.01)
*G03B 27/54* (2006.01)

(52) U.S. Cl. .......................... 359/365; 359/858; 355/67

(58) Field of Classification Search ......... 359/362–367, 359/725–732, 850–861; 355/52–64
See application file for complete search history.

(56) References Cited

U.S. PATENT DOCUMENTS

| 4,701,035 | A | 10/1987 | Hirose | 359/366 |
|---|---|---|---|---|
| 5,686,728 | A | 11/1997 | Shafer | 250/492.2 |
| 5,815,310 | A | 9/1998 | Williamson | 359/365 |
| 6,172,825 | B1 | 1/2001 | Takahashi | 359/859 |
| 6,556,648 | B1 | 4/2003 | Bal et al. | 378/34 |
| 6,710,917 | B2 | 3/2004 | Mann et al. | 359/365 |
| 6,781,671 | B2 | 8/2004 | Komatsuda | 355/67 |
| 6,912,042 | B2 * | 6/2005 | Shafer | 355/67 |
| 2002/0056815 | A1 * | 5/2002 | Mann et al. | 250/492.2 |
| 2002/0129328 | A1 | 9/2002 | Komatsuda | 716/21 |
| 2004/0012866 | A1 | 1/2004 | Mann et al. | 359/857 |
| 2004/0189968 | A1 | 9/2004 | Terasawa | 355/67 |

FOREIGN PATENT DOCUMENTS

| EP | 1 434 093 A2 * | 6/2004 | 359/355 |
|---|---|---|---|
| JP | 09-211332 | 8/1997 | |
| JP | 2002-116382 * | 4/2002 | 359/366 |
| JP | 2002-139672 | 5/2002 | |

OTHER PUBLICATIONS

English translation of the Japanese reference No. 2002-116382.*

* cited by examiner

*Primary Examiner*—Thong Nguyen
(74) *Attorney, Agent, or Firm*—Finnegan, Henderson, Farabow, Garrett, & Dunner, L.L.P.

(57) ABSTRACT

A reflective-type projection optical system has 8 reflective mirrors that form a reduced image of a first surface on a second surface. A first reflective imaging optical system (G1) forms an intermediate image of the first surface, and a second reflective imaging optical system (G2) forms an image of the intermediate image on the second surface. The first reflective imaging optical system has, from the first surface side in order of light beam incidence, a first reflective mirror (M1), a second reflective mirror (M2), a third reflective mirror (M3), and a fourth reflective mirror (M4). The second reflective imaging optical system has, from the first surface side in order of light beam incidence, a fifth reflective mirror (M5), a sixth reflective mirror (M6), a seventh reflective mirror (M7), and an eighth reflective mirror (M8). At least one of the reflective surfaces of these 8 reflective mirrors is composed of a spherical surface.

13 Claims, 21 Drawing Sheets

REFLECTIVE-TYPE PROJECTION OPTICAL SYSTEM AND EXPOSURE APPARATUS EQUIPPED WITH SAID REFLECTIVE-TYPE PROJECTION OPTICAL SYSTEM

TECHNICAL FIELD

The present invention pertains to a reflective-type projection optical system and an exposure apparatus equipped with the reflective-type projection optical system; pertaining, for example, to a reflective-type projection optical system suited to an X-ray projection exposure apparatus that transfers a circuit pattern on a mask onto a photosensitive substrate by mirror projection method using X-ray (EUV light).

BACKGROUND OF THE INVENTION

Conventionally, in an exposure apparatus used in the manufacture of semiconductor elements and the like, a circuit pattern formed on a mask (reticle) is projection transferred onto a photosensitive substrate such as a wafer via a projection optical system. Resist is coated onto the photosensitive substrate and the resist is sensitized by projection exposure via the projection optical system, obtaining a resist pattern corresponding to the mask pattern.

Thus, the resolution power W of the exposure apparatus is dependent on wavelength λ of the exposure light and numerical aperture NA of the projection optical system and is expressed by the following formula (a).

$$W = K \cdot \lambda / NA \quad (K: \text{constant}) \tag{a}$$

Accordingly, in order to improve the resolution power of the exposure apparatus, it is necessary to either shorten the wavelength λ of the exposure light or increase the numerical aperture NA of the projection optical system. In general, from an optics design perspective it is difficult to increase the numerical aperture NA of the projection optical system above a specific value; therefore from this point it is necessary to shorten the wavelength of the exposure light. For example, as an exposure light, an image resolution power of 0.25 μm can be obtained using a KrF excimer laser of wavelength 248 nm, and an image resolution power of 0.1 μm or less can be obtained at a wavelength of 13 nm using, for example, an ArF excimer laser of wavelength 193 nm.

By the way, in the case where X-rays are used as the exposure light, usable transmissive optical materials and refractive optical materials are not available; therefore a reflective-type mask and a reflective-type projection optical system are used. Conventionally, as a projection optical system that can be applied in an exposure apparatus using X-rays as the exposure light, various reflective-type projection optical systems have been proposed, such as Unexamined Patent Application Publication No. H9-211332 Official gazette (application corresponding to U.S. Pat. No. 5,815,310) and Unexamined Patent Application No. 2002-139672 Official gazette (application corresponding to U.S. Pat. No. 6,710,917).

However, in the reflective-type projection optical system disclosed in U.S. Pat. No. 5,815,310 as a conventional example of a reflective-type projection optical system composed of 6 reflective mirrors, all 6 reflective mirrors are configured having aspheric reflective surfaces; therefore, normal aspheric finishing (grinding, polishing) and measurement processes are necessary, causing much effort, time and cost.

In addition, in the reflective-type projection optical system disclosed in U.S. Pat. No. 6,710,917 as a conventional example of a reflective-type projection optical system composed of 8 reflective mirrors, the sixth mirror of the 8 reflective mirrors is formed of spherical surfaces. In an embodiment of the publication concerned, between the second and third reflective mirrors, and then between the sixth and seventh reflective mirrors, an optical system having two intermediate images is used; the sixth reflective mirror is a reflective mirror having a use region (the region where light beams that contribute to imaging are reflected by the reflective mirror, also called "effective region") in a position farthest from the optical axis. Thus, by forming the sixth reflective mirror, having a use region separated from the optical axis, as a spherical surface, inspection of the sixth reflective mirror is easily done using an interferometer. This is because the farther away the use region is from the optical axis, the harder it is to inspect the degree of asphericity using an interferometer. However, in the reflective-type projection optical system concerned, there is the problem that the effective diameter of the sixth reflective mirror ends up expanding to close to 800 mm. In addition, with respect to as many reflective mirrors as possible, in order to maintain a use region close to the axis, a triple imaging optical system equipped with two intermediate images Z1 and Z2 is used. For that reason, there is also the problem that extension of the distance from the physical object to the image (distance between object and image) to close to 2m cannot be avoided, expanding the size of the entire optical system. In addition, because the reflective mirrors are aspheric surfaces, which demand more stringent manufacturing tolerances, distortion caused by manufacturing tolerances occurs easily when the projection optical system is actually manufactured, and it is difficult to manufacture an optical system that is true to the design.

SUMMARY OF THE INVENTION

The present invention has been made by considering the above problems, and has as an object the provision of a reflective-type projection optical system that greatly reduces the time and expense needed for manufacturing by miniaturizing the reflective mirrors as well as reducing the entire length of the optical system by means of using a double imaging optical system equipped with 8 reflective mirrors, of which at least one reflective mirror is formed in a spherical shape. In addition, the present invention has another object of providing a projection optical system with relatively eased manufacturing tolerance requirements. Furthermore, it has the object of providing, by applying the projection optical system of the present invention to an exposure apparatus, an exposure apparatus that can maintain a high resolution power using X-rays for example as the exposure light.

In order to resolve the above mentioned problems, a first embodiment of the present invention provides, with respect to a reflective-type projection optical system that has 8 reflective mirrors and that forms a reduced image of a first surface on a second surface. The reflective-type projection optical system has a first reflective imaging optical system for forming an intermediate image of the first surface and a second reflective imaging optical system for forming an image of the intermediate image on the second surface; the first reflective imaging optical system has, from the first surface side in order of light beam incidence, a first reflective mirror M1, a second reflective mirror M2, a third reflective mirror M3, and a fourth reflective mirror M4; the second reflective imaging optical system has, from the first surface side in order of light beam incidence, a fifth reflective mirror M5, a sixth reflective mirror M6, a seventh reflective mirror M7, and an eighth reflective mirror M8; and at least one of the reflective surfaces of these 8 reflective mirrors is composed of a spherical surface while the other reflective surfaces consist of aspheric surfaces.

By means of the projection optical system concerned, the maximum effective diameter of the reflective mirrors composing the projection optical system can be reduced while also reducing the overall length of the optical system, preventing expansion of the apparatus.

In a second embodiment of the second invention, an exposure apparatus is provided having an illumination system for illuminating a mask set on a first surface and a reflective-type projection optical system for projection exposure of the mask pattern onto a photosensitive substrate set on a second surface. According to a preferable form of the second embodiment, the illumination system has a light source for supplying X-rays as the exposure light, and the mask pattern is projection exposed onto the photosensitive substrate by moving the mask and the photosensitive substrate relative to the reflective-type projection optical system.

In the reflective-type projection optical system of the present embodiments, by using a double imaging optical system equipped with 8 reflective mirrors, of which the surface of at least one is formed in a spherical shape, surface finishing (grinding, polishing), measurement of the reflective mirrors, and assembly adjustments can be done relatively easily while reducing the size of the reflective mirrors as well as reducing the overall length of the optical system, and the time and expense needed for manufacturing can be greatly reduced. In addition, by forming in a spherical shape at least the surface of that reflective mirror that requires a relatively severe manufacturing tolerance, from among the 8 reflective mirrors in the reflective projection optical system it is possible to manufacture relatively easily a reflective optical system that has high precision requirements.

In addition, by applying the reflective-type projection optical system to an exposure apparatus, it is possible to use X-rays as the exposure light. In this case, the mask pattern is projection exposed onto the photosensitive substrate by moving the mask and the photosensitive substrate relative to the projection optical system.

As a result, it is possible to manufacture a highly precise micro-device under favorable exposure conditions using a scanning-type exposure apparatus having a large resolution power.

DETAILED DESCRIPTION OF THE EMBODIMENTS

Figure 1:
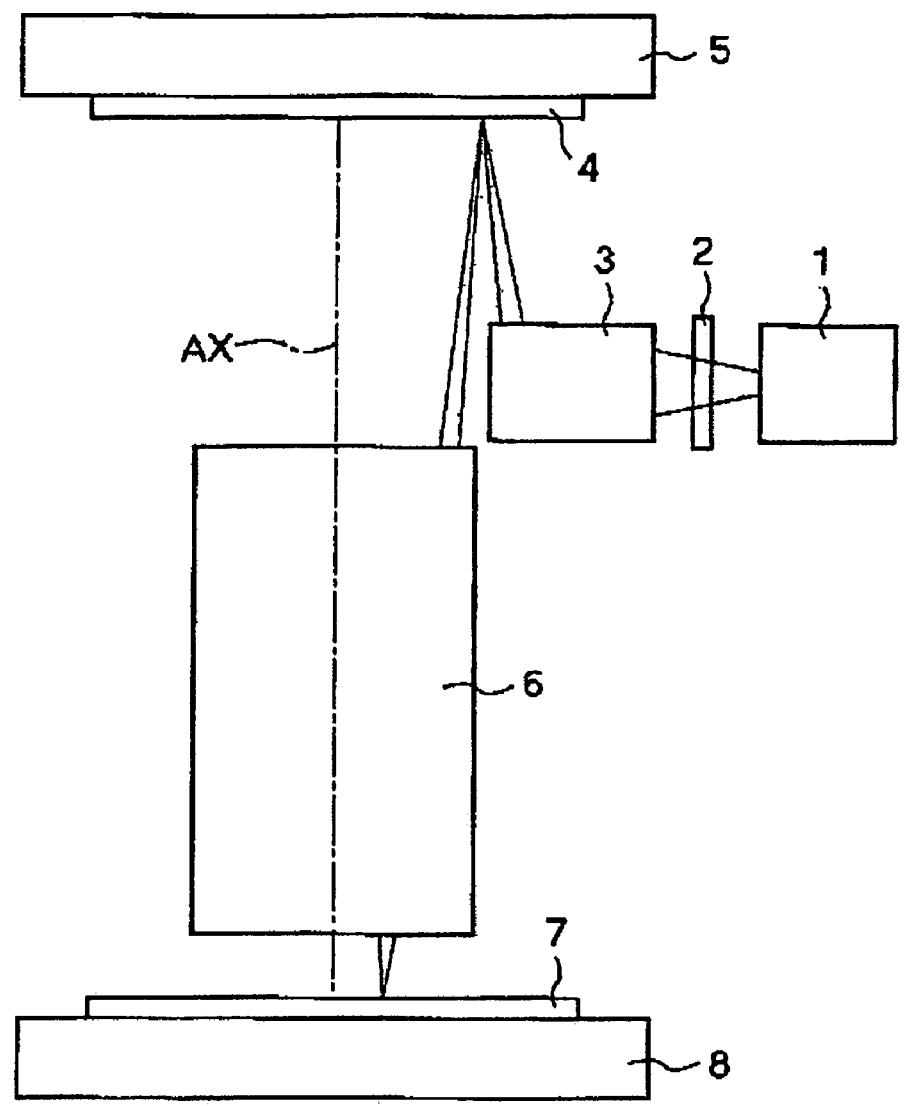
FIG. 1 is a drawing showing an outline of the configuration of the exposure apparatus of an embodiment of the present invention.

In the reflective-type projection optical system of the present invention, light from a first surface (object surface) forms an intermediate image of the first surface via a first reflective imaging optical system G1. Then, light from the intermediate image of the first surface formed via the first reflective imaging optical system G1 forms an intermediate image (a reduced image of the first surface) on a second surface (image surface) via a second reflective imaging optical system G2.

The first reflective imaging optical system G1 is composed of a first reflective mirror M1 for reflecting light from the first surface, a second reflective mirror M2 for reflecting the light reflected by the first reflective mirror M1, a third reflective mirror M3 for reflecting the light reflected by the second reflective mirror M2, and a fourth reflective mirror M4 for reflecting the light reflected by the third reflective mirror M3. Also, the second reflective imaging optical system G2 is composed of a fifth reflective mirror M5 for reflecting light from the intermediate image, a sixth reflective mirror M6 for reflecting the light reflected by the fifth reflective mirror M5, a seventh reflective mirror M7 for reflecting the light reflected by the sixth reflective mirror M6, and an eighth reflective mirror M8 for reflecting the light reflected by the seventh reflective mirror M7.

In particular, it is preferable that the reflective surface of the fourth reflective mirror M4 or the fifth reflective mirror M5 be spherical. The reason is that the fourth reflective mirror M4 or the fifth reflective mirror M5 are the mirrors farthest separated from the optical axis, and when their form was like a part of a bracelet, the processes of polishing, inspection, reflective film coating and assembly were quite difficult. If this reflective surface can be formed as a spherical surface, the steps of polishing, inspection, assembly, etc. become much easier, resulting in a large cost reduction.

In addition, it is preferable that the reflective surface of the reflective mirror with the highest requirements for manufacturing tolerances from among the 8 reflective mirrors be made in a spherical shape. For example, because the manufacturing tolerance requirements become severe for reflective mirrors where the angle of incidence of light beams incident upon the reflective mirror is large and for reflective mirrors where the surface area of the region reflecting light beams that contribute to imaging (effective region) is small, it is preferable that these kinds of mirrors be composed of a spherical surface. This is because when the shape of the reflective surface of a reflective mirror with severe manufacturing tolerance requirements deviates even a little from the ideal designed shape, a relatively large distortion appears, ultimately deteriorating the imaging performance. The processing of a spherical surface can be done comparatively more precisely than the processing of an aspheric surface, therefore a precise projection optical system can be more easily manufactured. Accordingly, it is possible to manufacture a more precise projection optical system at low cost.

In the present invention, it is desirable that the distance d1 between the first surface and the first reflective mirror M1 satisfy the following conditional expression (1).

$$700 \text{ mm} \leq d1 \tag{1}$$

If [d1] falls below the lower limit value of conditional expression (1), the angle of incidence of the rays onto the reflective surface grows too large, and it becomes difficult to correct the distortion that occurs.

In addition, in the present invention, if the distance between the first reflective mirror M1 and the second reflective mirror M2 is identified as d2, then it is desirable that the following conditional expression (2) be satisfied.

$$450 \text{ mm} \leq d2 \tag{2}$$

If [d2] falls below the lower limit value of conditional expression (2), the angle of incidence of the rays onto the reflective surface grows too large, and it becomes difficult to correct the distortion that occurs.

In addition, in the present invention, if the distance between the second reflective mirror M2 and the third reflective mirror M3 is identified as d3, then it is desirable that the following conditional expression (3) be satisfied.

$$570 \text{ mm} \leq d3 \tag{3}$$

If [d3] falls below the lower limit value of conditional expression (3), the angle of incidence of the rays onto the reflective surface grows too large and it becomes difficult to correct the distortion that occurs.

By using the above configuration, even composing of a spherical surface any arbitrary surface of a reflective mirror from among the first reflective mirror M1 through eighth reflective mirror M8, it is possible to maintain adequate optical performance.

If an aperture stop AS is disposed on the second reflective mirror M2, it is possible to adequately avoid light beam interference, thus it is preferable due to being able to make smaller the effective diameter of the reflective mirrors of the first imaging optical system. In this case, the position where the aperture stop is disposed is limited to immediately in front of the reflective mirror, thus it becomes difficult to balance upper coma aberration and lower coma aberration.

In this type of case, by making sufficiently long the distance d1 between the first surface and the first reflective mirror M1, the distance d2 between the first reflective mirror M1 and the second reflective mirror M2, and the distance d3 between the second reflective mirror and the third reflective mirror M3, it is possible to reduce the light ray angle of incidence onto each reflective mirror, thus occurrence of distortion can be reduced and distortion can be satisfactorily corrected.

In addition, in the present invention, it is preferable that the ratio of d1 to d2, d1/d2, satisfy the following conditional expression (4).

$$1 < d1/d2 < 1.9 \tag{4}$$

If it falls outside of conditional expression (4), the balance of the upper and lower frames deteriorates and is difficult to correct. In addition, in the present invention, it is preferable that the ratio of d3 to d2, d3/d2, satisfy the following conditional expression (5).

$$1.1 < d3/d2 < 1.5 \tag{5}$$

If it falls outside of conditional expression (5), the balance of the upper and lower coma aberration deteriorates and is difficult to correct.

By means of the above configuration, even if the sixth mirror M6 is composed of a spherical surface, it becomes possible to adequately maintain optical performance.

In addition, in the present invention, by using a configuration wherein the reduced image of the first surface is formed by double imaging onto the second surface, it is possible to satisfactorily correct distortion (distortion).

The reflection angle of the light rays from both the first reflective mirror and the second reflective mirror as well as the reflection angle of the light rays from mirrors other of these, for example the third reflective mirror, can be kept small.

By using the above disposition, it is possible to suppress the maximum diameter of the reflective mirrors as well as appropriately place the disposition of each reflective mirror and aperture stop without blockage of the light beams.

In addition, by holding down the angle of incidence of light rays onto the third reflective mirror M3, it is possible to suppress the effective diameter of the fourth reflective mirror M4, which tends to have a large effective diameter.

As per the above, with the present invention it is possible to realize a reflective-type projection optical system that has good reflective characteristics even with X-rays, and that can perform satisfactory corrections while suppressing enlargement of the reflective mirrors.

In addition, with the present invention, it is preferable that the effective diameter Mφ of reflective mirrors M1 through M8 satisfy the following conditional expression (6) for each reflective mirror.

$$400 \text{ mm} \leq M\phi \leq 600 \text{ mm} \tag{6}$$

When the upper limit value of conditional expression (6) is exceeded, the effective diameter of the affected reflective mirror grows too large and the optical system expands, so it is not desirable. When it falls short of the lower limit value, [the system] becomes too small and threatens deterioration of optical performance, and thus is undesirable.

Also, when the maximum effective diameter of the reflective mirror is Mφ and the maximum object height on the object surface is H0, it is preferable that the following conditional expression (7) be satisfied.

$$2 < M\phi/H0 < 4 \quad (7)$$

When the upper limit value of conditional expression (7) is exceeded, the effective diameter of the affected reflective mirror grows too large and the optical system expands, so it is not desirable. When it falls short of the lower limit value, [the system] becomes too small and threatens deterioration of optical performance, and thus is undesirable.

In the present invention, when the axial interval (distance between object and image) from the physical object (reticle) to the image (wafer) is identified as TT, it is preferable that the following conditional expression (8) be satisfied.

$$1350 \text{ mm} < TT < 1800 \text{ mm} \quad (8)$$

In the case that [TT] is smaller than the lower limit of conditional expression (8), mechanical interference between the reticle or wafer and the reflective mirrors develops easily, which worsens optical performance and thus is undesirable. Then, when the upper limit is exceeded the optical system grows large, which is also undesirable. Having a certain amount of length, a length that can maintain good optical performance and reduce the light ray angle of incidence onto the reflective mirrors, is preferable. In particular it is necessary to make the distance from the reticle to the reflective mirror closest to the reticle and the distance from the wafer to the reflective mirror closest to the wafer sufficiently large, because of the thickness of the cooling apparatus that must be set on the back surface of each reflective mirror. For this reason, it is necessary that the distance TT between object and image have a certain amount of length and thus it is preferable that the conditional expression (8) be satisfied.

In the present invention, when the axial interval (distance between object and image) from the physical object (reticle) to the image (wafer) is identified as TT, it is preferable that the following conditional expression (9) be satisfied.

$$8 < TT/H0 < 15 \quad (9).$$

In the case that [TT] is smaller than the lower limit of conditional expression (9), mechanical interference between the reticle or wafer and the reflective mirrors develops easily, which worsens optical performance and thus is undesirable. Then, when the upper limit is exceeded the optical system grows large, which is also undesirable. Having a certain amount of length, a length that can maintain good optical performance and reduce the light ray angle of incidence to the reflective mirrors, is preferable. In particular it is necessary to make the distance from the reticle to the reflective mirror closest to the reticle and the distance from the wafer to the reflective mirror closest to the wafer sufficiently large, because of the thickness of the cooling apparatus that must be set on the back surface of each reflective mirror. For this reason, it is necessary that the distance TT between object and image have a certain amount of length and thus it is preferable that the conditional expression (9) be satisfied.

In the present invention, it is preferable to form the reflective surface of each reflective mirror in an aspheric shape with rotational symmetry relative to the optical axis and to make the maximum order of the aspheric surface defining each reflective surface greater than $10^{th}$ order, in order to adequately correct distortion and improve optical performance. Also in the present invention, it is desirable that it be an optical system nearly telecentric on the second surface side. By means of this configuration, in the case of application in an exposure apparatus for example, it is possible to have satisfactory imaging even if there is roughness on the wafer within the focal depth of the projection optical system.

Also, by applying the project optics system of the present invention to an exposure apparatus, it is possible to use X-rays as the exposure light. In this case, the mask pattern is projection exposed onto the photosensitive substrate by moving the mask and the photosensitive substrate relative to the projection optical system. As a result, it is possible to manufacture a highly precise microdevice under favorable exposure conditions using a scanning-type exposure apparatus having a large resolution power.

Moreover, in the present invention, with respect to a reflective-type projection optical system that has at least 8 reflective mirrors and that forms a reduced image of the first surface on the second surface, it is desirable that the reflective surface of that reflective mirror having a relatively high requirement for manufacturing tolerance be composed of a spherical surface. It is desirable, for example, that reflective mirrors where the angle of incidence of light beams incident upon the reflective mirror is large and for reflective mirrors where the surface area of the region reflecting light beams that contribute to imaging (effective region) is relatively small be composed of a spherical surface. This is because when the shape of the reflective surface of a reflective mirror with severe manufacturing tolerance requirements deviates even a little from the ideal designed shape, a relatively large distortion appears, ultimately deteriorating the imaging performance. The processing of a spherical surface can be done comparatively more precisely than the processing of an aspheric surface, therefore a precise projection optical system can be more easily manufactured. Accordingly, it is possible to manufacture a more precise projection optical system at low cost.

We will further explain embodiments of the present invention based on the attached drawings.

FIG. 1 is a drawing showing an outline of the configuration of the exposure apparatus of an embodiment of the present invention.

Figure 2:
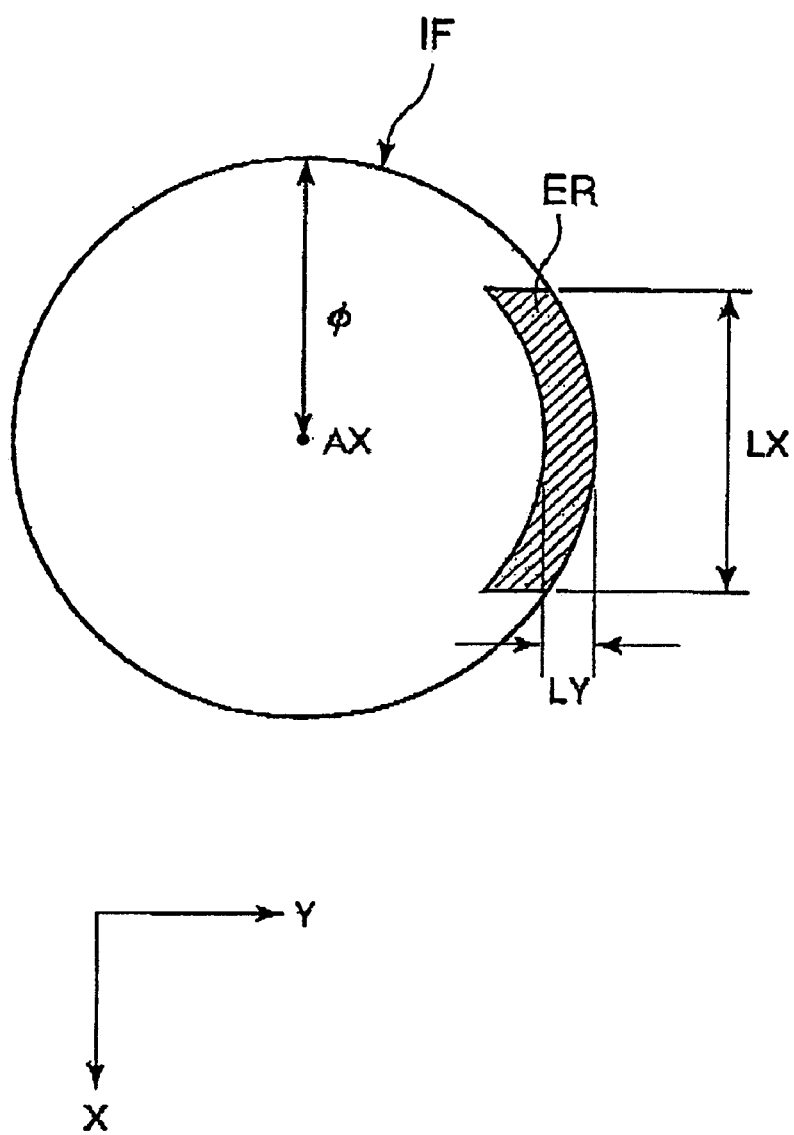
FIG. 2 is a drawing showing the positional relationship between the arc-shaped exposure region formed on the wafer (that is to say, the effective exposure region) and the optical axis.

In addition, FIG. 2 is a drawing showing the positional relationship between the arc-shaped exposure region formed on the wafer (that is to say, the effective exposure region) and the optical axis. In FIG. 1, a Z-axis is set along the optical axis direction of the projection optical system, that is to say along the normal direction of the wafer that is a photosensitive substrate. A Y-axis is set in the wafer surface in the direction parallel to the paper surface of FIG. 1, and an X-axis is set in the wafer surface in the direction vertical to the paper surface of FIG. 1.

The exposure apparatus of FIG. 1 is equipped with a laser plasma X-ray source 1, for example, as a light source for supplying exposure light. The light emitting from the X-ray source 1 is incident upon illumination optical system 3 via wavelength selection filter 2. Wavelength selection filter 2 has the characteristic of passing only a specified wavelength (13.5 nm) of X-rays from the light supplied from X-ray source 1 and intercepting the passage of light of other wavelengths.

The X-rays passing through wavelength selection filter 2 illuminate a reflective-type mask 4 that forms the pattern to be transferred, via the illumination optical system 3 composed of multiple reflective mirrors.

Mask 4, is retained by a mask stage 5 that is movable along the Y-direction so as to extend that pattern surface along the XY plane. Then, the movement of mask stage 5 is measured by a laser interferometer omitted from the drawing. In this way, an arc-shaped illumination region that is symmetrical with respect to the Y-axis is formed on mask 4.

The light from the illuminated mask 4 forms an image of the mask pattern on wafer 7, which is a photosensitive substrate, via a reflective-type projection optical system 6. That is to say, as shown in FIG. 2, an arc-shaped illumination region that is symmetrical with respect to the Y-axis is formed on wafer 7. Referring to FIG. 2, within a circular region IF (image circle) having a radius φ centered on optical axis AX, a circular effective exposure region (effective imaging region) ER having length LX in the X-direction and length LY in the Y-direction is set so as to touch image circle IF.

Wafer 7 is retained by a wafer stage 8 that is movable in two dimensions along the X- and Y-directions for the exposure surface to extend along with XY plane. Note that the movement of wafer stage 8, similar to wafer stage 5, is measured by a laser interferometer omitted from the drawing. In this way, by performing scanning exposure (scanning exposure) while mask stage 5 and wafer stage 8 are moved along the Y-direction, that is to say while mask 4 and wafer 7 are moved in the Y-direction relative to projection optical system 6, the pattern of mask 4 is transferred to one exposure region of wafer 7.

At this time, in the case that the projection magnification (transfer magnification) of projection optical system 6 is ¼, the movement speed of mask stage 5 is set to ¼ of the movement speed of wafer stage 8 and synchronous scanning is performed. Also, by repeating scanning exposure while moving wafer stage 8 two-dimensionally in the X-direction and the Y-direction, the pattern of mask 4 is successively transferred to each exposure region of wafer 7. Below we will explain the concrete configuration of projection optical system 6, referring to embodiment examples 1 through 9.

In each embodiment, projection optical system 6 consists of a first reflective imaging optical system G1 for forming an intermediate image of the pattern of mask 4 and a second reflective imaging optical system G2 for forming an intermediate image of the mask pattern (a secondary image of the pattern of mask 4) on wafer 7. Here, the first reflective imaging optical system G1 is composed of 4 reflective mirrors M1 through M4, and the second reflective imaging optical system G2 is composed of 4 reflective mirrors M5 through M8.

Note that in each embodiment example, at least one reflective surface from among the 8 reflective mirrors is formed in a spherical shape. Also, in each embodiment example, immediately in front of the second reflective mirror M2, an aperture stop AS is disposed. It is okay for aperture stop AS to touch reflective mirror M2, and it is also okay to dispose it adjacent thereto. Moreover, in each embodiment example, projection optical system 6 is a telecentric optical system on the wafer side (image side).

Also, in each embodiment example, the third reflective mirror M3 is disposed in the space on the image surface side facing the first reflective mirror M1, but it is possible to obtain a similar operation without being limited to this, by disposing the third reflective mirror M3 in the space on the object side facing the first reflective mirror M1.

In each embodiment example, when the height of the aspheric surface in the direction perpendicular to the optical axis is y, the distance (sag amount) along the optical axis from a plane tangent to the vertex of the aspheric surface to the position on the aspheric surface at height y is z, the curvature radius is r, the constant of the cone is K, and the 4$^{th}$ order, 6$^{th}$ order, 8$^{th}$ order and 10$^{th}$ order aspheric surface coefficients are A, B, C, and D respectively, the aspheric surface is expressed by the following formula (b).

(Formula 1) (b)

$$z = (y^2/r) / \left\{ 1 + \{1 - (1+k) \cdot y^2/r^2\}^{\frac{1}{2}} \right\} + A \cdot y^4 + B \cdot y^6 + C \cdot y^8 + D \cdot y^{10} + \ldots$$

Embodiment 1

Figure 3:
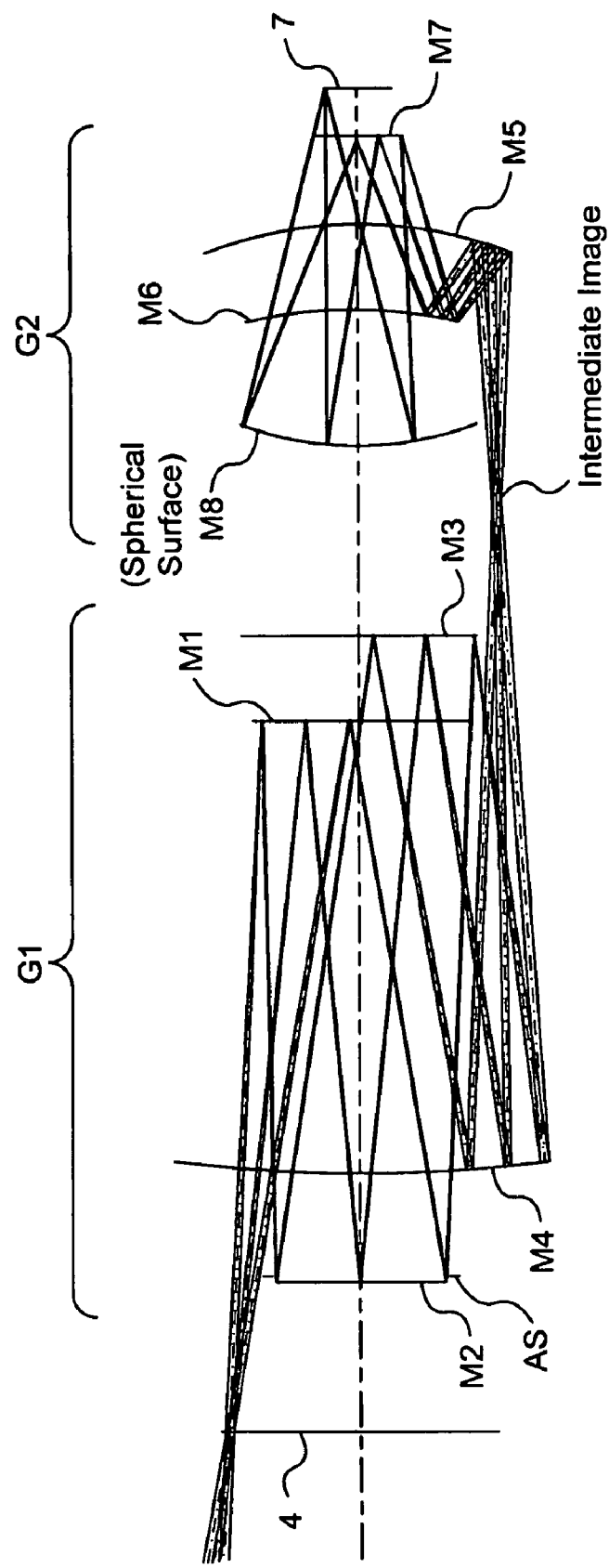
FIG. 3 is a drawing showing the configuration of the projection optical system of a first embodiment of the present invention.

FIG. 3 is a drawing showing the configuration of the projection optical system of a first embodiment of the present invention.

Referring to FIG. 3, in the projection optical system of the first embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7.

The concave surface of the eighth reflective mirror M8 of the projection optical system of this first embodiment is composed of a spherical surface.

In the next Chart (1), the values of various factors of the projection optical system involved in the first embodiment are shown. In Chart (1), λ expresses the wavelength of the exposure light, β expresses the projection magnification ratio, NA expresses the numerical aperture on the image side (wafer side), H0 expresses the maximum object height on mask 4, φ expresses the radius of image circle IF on wafer 7 (maximum image height), LX expresses the dimension along the X-direction of the effective exposure region ER, and LY expresses the dimension along the Y-direction of the effective exposure region ER. Also, Mφ expresses the effective diameter of the largest reflective mirror and TT expresses the axial interval between mask 4 and wafer 7.

Also, for the surface numbers, in the sequence of reflective surfaces from the mask side along the direction traveled by the light rays from the mask surface that is the object surface to the wafer surface that is the image surface, r is the vertex curvature radius (mm) of each reflective surface and d is the axial interval, that is to say the surface interval (mm) of each reflective surface. Note that for surface interval d, the sign changes for each reflection. Also, the distance from the mask surface to the first reflective mirror M1 is d1, the distance from the first reflective mirror to the second reflective mirror is d2, and the distance from the second reflective mirror to the third reflective mirror is d3. Then, the convex curvature radius facing the mask side, regardless on the direction of incidence of the light rays, is positive and the concave curvature radius is negative. The above notation is the same for the following Chart (2) through Chart (9).

CHART 1

(Major Factors)

$\lambda = 13.5$ nm
$\beta = \frac{1}{4}$
NA = 0.25
H0 = 156 mm
$\phi = 40$ mm
LX = 26 mm
LY = 2 mm

(Optical Member Factors)

| Surface Number | r | d | Optical Member |
|---|---|---|---|
| S0 | (mask surface) | 853.78 | |
| S1 | 19905.36 | −674.34 | (first reflective mirror M1) |
| S2 | 1641.16 | 774.34 | (second reflective mirror M2) |
| S3 | 2714.26 | −643.96 | (third reflective mirror M3) |
| S4 | 2000.00 | 1132.02 | (fourth reflective mirror M4) |
| S5 | −516.16 | −100.00 | (fifth reflective mirror M5) |
| S6 | −669.72 | 200.10 | (sixth reflective mirror M6) |
| S7 | 296.26 | −354.43 | (seventh reflective mirror M7) |
| S8 | 440.87 (wafer surface) | 412.49 | (eighth reflective mirror M8) spherical surface |

(Aspheric Surface Data)

S1 Surface $\kappa = 0.00$
A = 8.96915E−12   B = 4.57005E−15   C = −1.83735E−19   D = 8.60247E−24
E = −3.56869E−28   F = 1.00209E−32   G = −1.20203E−37   H = 0.00000E+00

S2 Surface $\kappa = 0.00$
A = 3.18467E−12   B = 3.26352E−16   C = 3.38845E−21   D = −2.12437E−25
E = 2.30692E−29   F = −1.32519E−33   G = 3.17447E−38   H = 0.00000E+00

S3 Surface $\kappa = 0.00$
A = −9.07468E−10   B = 1.43591E−15   C = 8.76013E−21   D = −3.72599E−25
E = 2.07244E−29   F = −6.63254E−34   G = 8.79762E−39   H = 0.00000E+00

S4 Surface $\kappa = 0.00$
A = −2.13729E−10   B = −8.32168E−16   C = 1.22199E−20   D = −3.29219E−25
E = 4.90034E−30   F = −4.07991E−35   G = 1.47092E−40   H = 0.00000E+00

S5 Surface $\kappa = 0.00$
A = 2.51736E−10   B = −2.83431E−14   C = 2.53784E−18   D = −1.25361E−22
E = 3.60082E−27   F = −5.65216E−32   G = 3.76339E−37   H = 0.00000E+00

S6 Surface $\kappa = 0.00$
A = 8.73334E−11   B = 1.51075E−14   C = −1.38072E−18   D = 1.13509E−22
E = −5.02784E−27   F = 5.30624E−32   G = 2.27212E−36   H = 0.00000E+00

S7 Surface $\kappa = 0.00$
A = 1.11175E−08   B = −8.63766E−14   C = 1.14445E−16   D = −3.307015E−20
E = 1.08345E−23   F = −2.19060E−27   G = 1.81307E−31   H = 0.00000E+00

S8 Surface

Spherical Surface

(Values Corresponding to Conditional Expression)

M$\phi$ = 435.34 mm (maximum at the fourth reflective mirror M4)
TT = 1600.0 mm
M$\phi$/H0 = 2.79
TT/H0 = 10.26
d1 = 853.78 mm
d2 = 674.34 mm CHART 1-continued d3 = 774.34 mm
d1/d2 = 1.27
d3/d2 = 1.15

Figure 4:
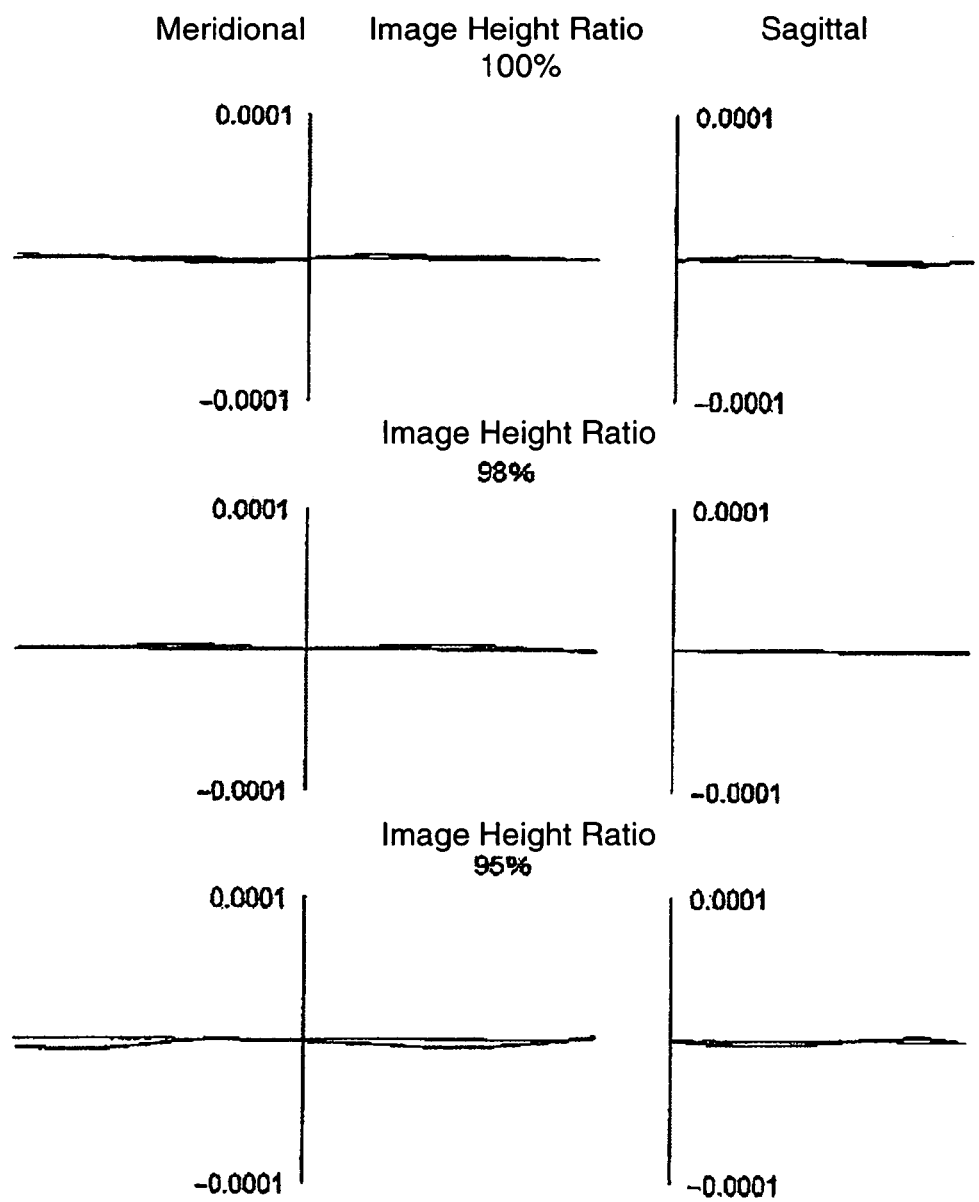
FIG. 4 is a drawing showing coma aberration in the projection optical system of the first embodiment.

FIG. 4 is a drawing showing coma aberration in the projection optical system of the first embodiment. In FIG. 4, the meridional coma aberration and sagittal coma aberration at image height 100%, image height 98%, and image height 95% are shown. As is clear from the aberration drawing, in the first embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 2

Figure 5:
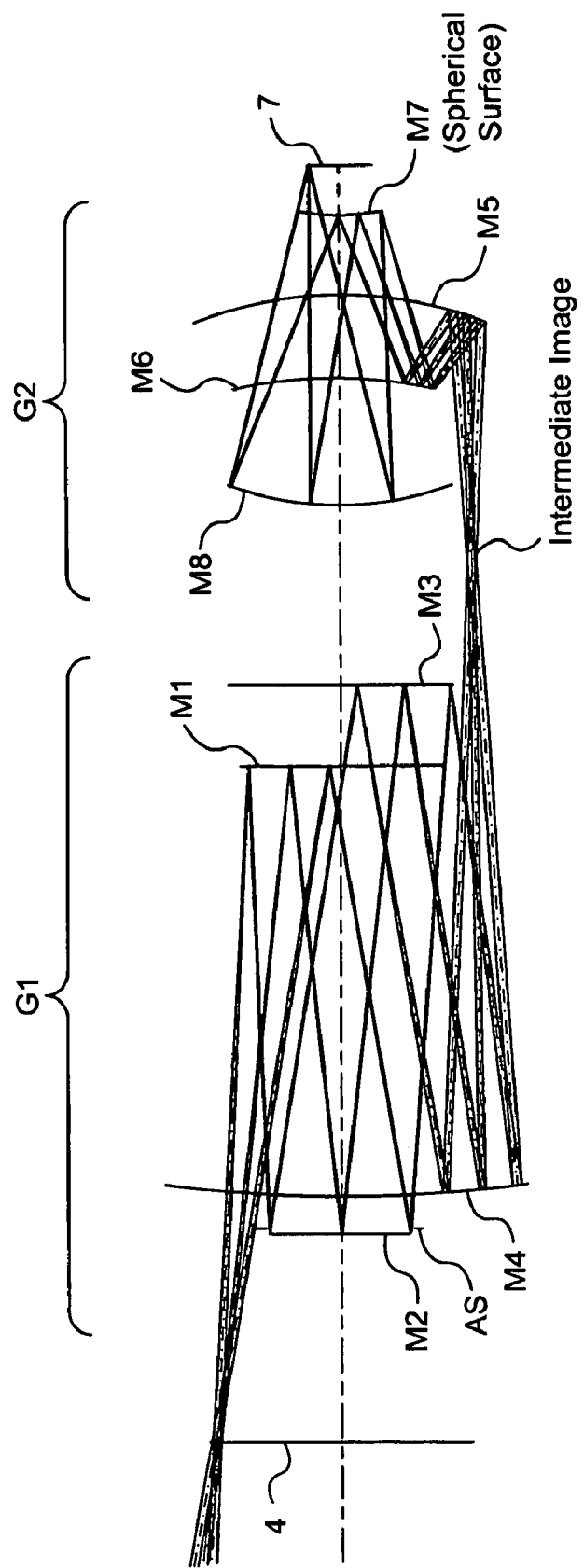
FIG. 5 is a drawing showing the configuration of the projection optical system of a second embodiment of the present invention.

FIG. 5 is a drawing showing the configuration of the projection optical system of a second embodiment of the present invention.

Referring to FIG. 5, in the projection optical system of the second embodiment, after the light from mask 4 is reflected sequentially by the concave reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment, the eighth reflective mirror is composed of a spherical surface, but in the present embodiment the convex seventh reflective mirror is composed of a spherical surface.

In the next Chart (2), the values of various factors of the projection optical system involved in the second embodiment are shown.

CHART 2

(Major Factors)

$\lambda$ = 13.5 nm
$\beta$ = ¼
NA = 0.25
H0 = 156 mm
$\phi$ = 40 mm
LX = 26 mm
LY = 2 mm (Optical Member Factors)

| Surface Number | r | d | Optical Member |
|---|---|---|---|
| S0 | (mask surface) | 853.38 | |
| S1 | −4000.53 | −482.41 | (first reflective mirror M1) |
| S2 | 2026.25 | 582.41 | (second reflective mirror M2) |
| S3 | 6778.35 | −542.84 | (third reflective mirror M3) |
| S4 | 1879.97 | 938.17 | (fourth reflective mirror M4) |
| S5 | −549.39 | −100.00 | (fifth reflective mirror M5) |
| S6 | −900.99 | 200.00 | (sixth reflective mirror M6) |
| S7 | 245.23 | −345.33 | (seventh reflective mirror M7) spherical surface |
| S8 | 438.06 | 427.54 | (eighth reflective mirror M8) |
| | (wafer surface) | | |

(Aspheric Surface Data)

S1 Surface $\kappa$ = 0.00
A = 4.12013E−10   B = 6.16521E−16   C = −2.33472E−20   D = 7.81561E−25
E = −5.08210E−29  F = 1.95820E−33   G = −3.29132E−38   H = 0.00000E+00

S2 Surface $\kappa$ = 0.00
A = −7.17094E−11  B = −2.37267E−15  C = −9.23185E−20   D = 2.71631E−23
E = −5.80866E−27  F = 6.58718E−31   G = −3.07733E−35   H = 0.00000E+00

CHART 2-continued

S3 Surface

κ = 0.00
A = −9.08546E−10   B = 1.93599E−15   C = 1.54171E−21   D = −1.14433E−24
E = 7.25350E−29    F = −2.27698E−33  G = 2.87734E−38   H = 0.00000E+00

S4 Surface

κ = 0.00
A = −3.26333E−10   B = −1.31852E−15  C = 2.17785E−20   D = −6.99551E−25
E = 1.20401E−29    F = −1.15499E−34  G = 4.70578E−40   H = 0.00000E+00

S5 Surface

κ = 0.00
A = −4.06078E−10   B = −2.02518E−14  C = 2.35353E−18   D = −1.18310E−22
E = 3.19720E−27    F = −4.55065E−32  G = 2.69146E−37   H = 0.00000E+00

S6 Surface

κ = 0.00
A = −2.15942E−09   B = 1.02618E−13   C = −7.03971E−18  D = 2.64439E−22
E = 1.05365E−27    F = −3.98918E−31  G = 9.07261E−36   H = 0.00000E+00

S7 Surface

Spherical Surface

S8 Surface

κ = 0.00
A = 4.10687E−11    B = 4.53532E−16   C = 2.41040E−21   D = 3.89228E−26
E = −1.67001E−31   F = −1.19286E−35  G = 3.37603E−40   H = 0.00000E+00

(Values Corresponding to Conditional Expression)

Mφ = 404.78 (maximum at fourth reflective mirror M4)
TT = 1530.9
Mφ/H0 = 2.59
TT/H0 = 9.81
d1 = 853.38 mm
d2 = 482.41 mm
d3 = 582.41 mm
d1/d2 = 1.77
d3/d2 = 1.21

Figure 6:
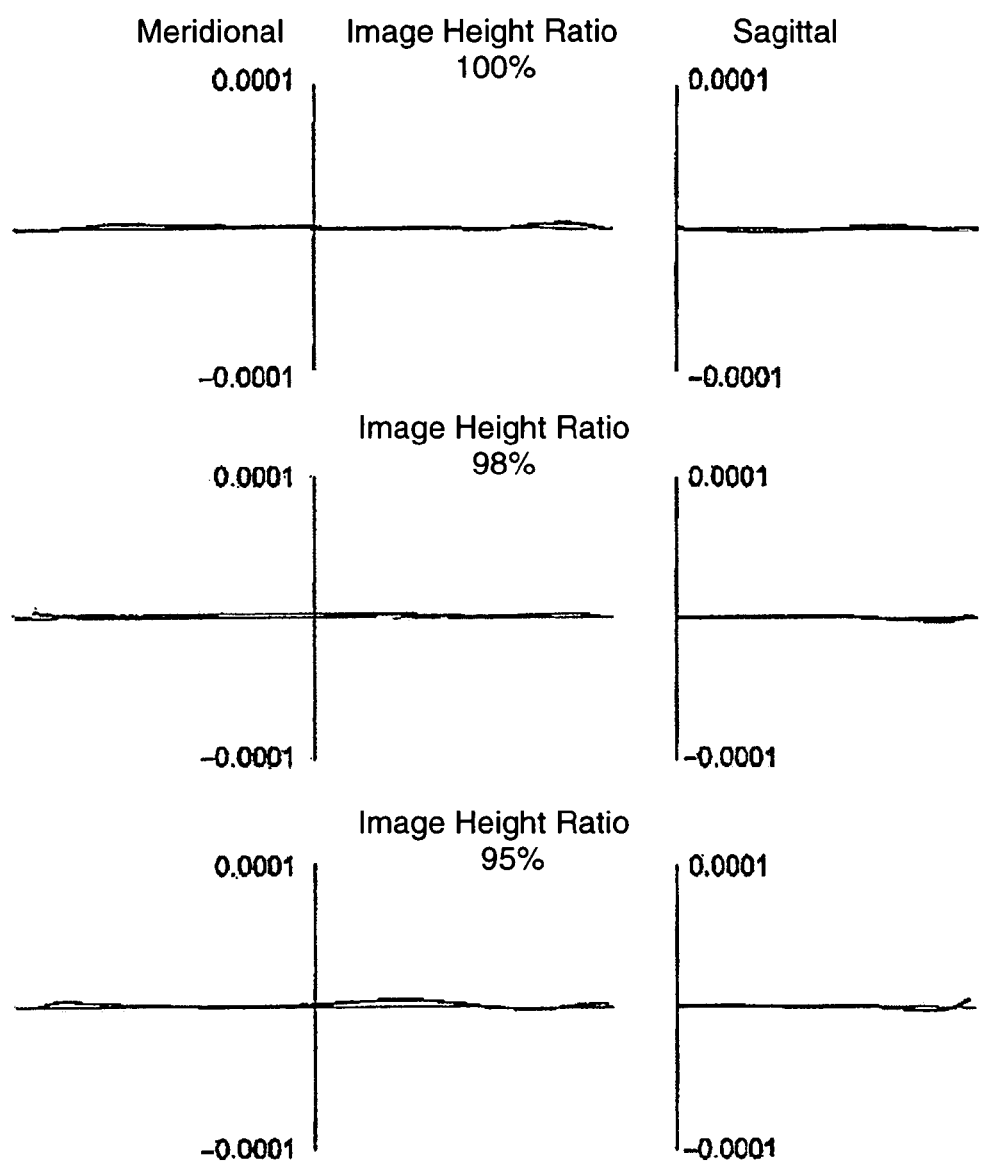
FIG. 6 is a drawing showing coma aberration in the projection optical system of the second embodiment.

FIG. 6 is a drawing showing coma aberration in the projection optical system of the second embodiment. In FIG. 6, the meridional coma aberration and sagittal coma aberration at image height 100%, image height 98%, and image height 95% are shown. As is clear from the aberration drawing, in the second embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 3

Figure 7:
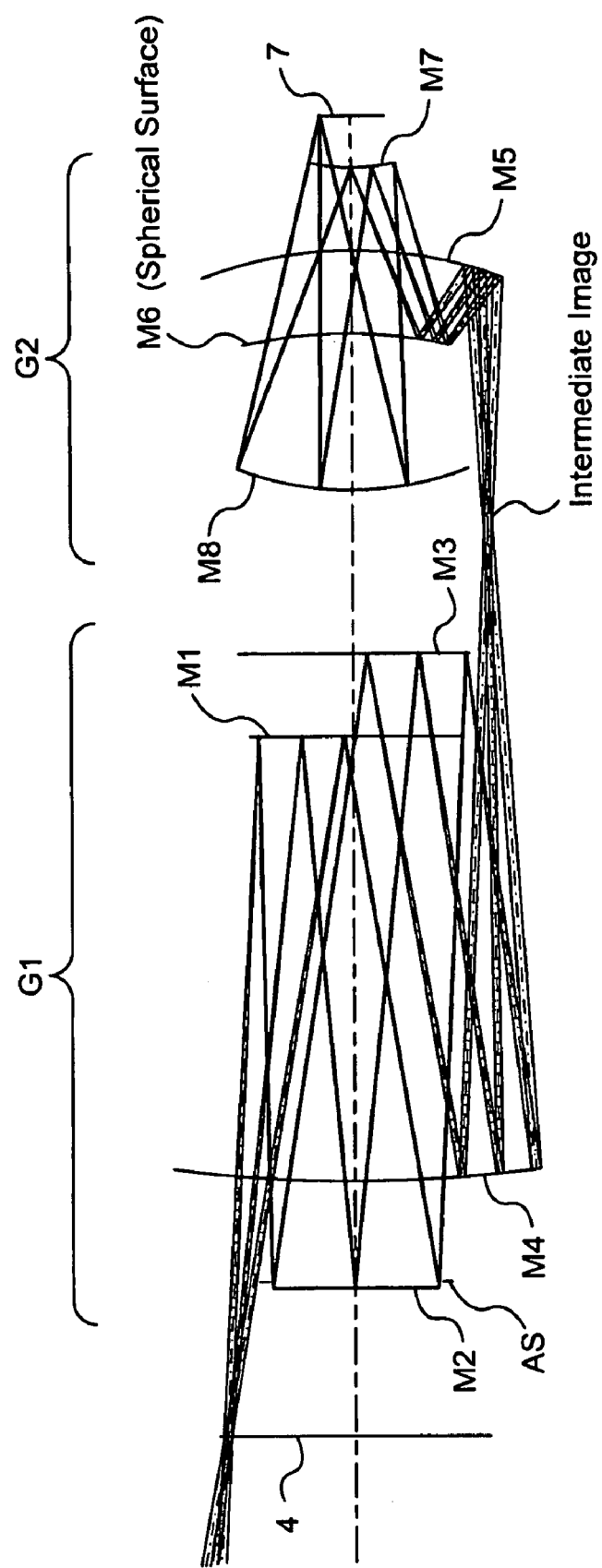
FIG. 7 is a drawing showing the configuration of the projection optical system of a third embodiment of the present invention.

FIG. 7 is a drawing showing the configuration of the projection optical system of a third embodiment of the present invention.

Referring to FIG. 7, in the projection optical system of the third embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the convex sixth reflective mirror is composed of a spherical surface.

In the next Chart (3), the values of various factors of the projection optical system involved in the third embodiment are shown.

CHART 3

(Major Factors)

$\lambda$ = 13.5 nm
$\beta$ = ¼
NA = 0.25
H0 = 156 mm
$\phi$ = 40 mm
LX = 26 mm
LY = 2 mm

(Optical Member Factors)

| Surface Number | r | d | Optical Member |
|---|---|---|---|
| S0 | (mask surface) | 836.47 | |
| S1 | 16673.90 | −695.19 | (first reflective mirror M1) |
| S2 | 1639.24 | 795.19 | (second reflective mirror M2) |
| S3 | 2815.49 | −648.41 | (third reflective mirror M3) |
| S4 | 2000.00 | 1066.92 | (fourth reflective mirror M4) |
| S5 | −512.93 | −100.00 | (fifth reflective mirror M5) |
| S6 | −643.25 | 200.03 | (sixth reflective mirror M6) spherical surface |
| S7 | 301.55 | −353.85 | (seventh reflective mirror M7) |
| S8 | 441.40 | 414.82 | (eighth reflective mirror M8) |
| | (wafer surface) | | |

(Aspheric Surface Data)

S1 Surface $\kappa$ = 0.00
A = 4.14433E−12   B = 3.61576E−15   C = −7.71811E−20   D = 2.64652E−24
E = −1.43402E−28   F = 5.56988E−33   G = −9.41512E−38   H = 0.00000E+00

S2 Surface $\kappa$ = 0.00
A = −2.84150E−11   B = 3.70117E−17   C = 4.22879E−22   D = −5.02449E−26
E = 3.31104E−30   F = −8.90095E−35   G = −1.76692E−40   H = 0.00000E+00

S3 Surface $\kappa$ = 0.00
A = −7.82732E−10   B = 9.89079E−16   C = −7.23616E−21   D = 8.03932E−25
E = −3.45519E−29   F = 8.18704E−34   G = −8.32530E−39   H = 0.00000E+00

S4 Surface $\kappa$ = 0.00
A = −2.25046E−10   B = −7.19387E−16   C = 8.48834E−21   D = −2.83313E−25
E = 4.73790E−30   F = −4.38195E−35   G = 1.73302E−40   H = 0.00000E+00

S5 Surface $\kappa$ = 0.00
A = 1.80833E−10   B = −2.77427E−14   C = 2.58714E−18   D = −1.25119E−22
E = 3.41819E−27   F = −5.03030E−32   G = 3.11125E−37   H = 0.0000E+00

S6 Surface

Spherical Surface

S7 Surface $\kappa$ = 0.00
A = 1.04479E−08   B = −4.88154E−14   C = 3.76442E−17   D = −8.28206E−21
E = 4.32265E−24   F = −1.17557E−27   G = 1.26940E−31   H = 0.00000E+00

S8 Surface $\kappa$ = 0.00
A = 3.98331E−11   B = 2.83203E−16   C = 1.97232E−21   D = −1.55350E−26
E = 1.96749E−30   F = −6.13747E−35   G = 7.82354E−40   H = 0.00000E+00

(Values Corresponding to Conditional Expression)

M$\phi$ = 435.74 (maximum at the fourth reflective mirror M4)
TT = 1516.0
M$\phi$/H0 = 2.79
TT/H0 = 9.72
d1 = 836.47 mm CHART 3-continued d2 = 695.19 mm
d3 = 795.19 mm
d1/d2 = 1.20
d3/d2 = 1.14

Figure 8:
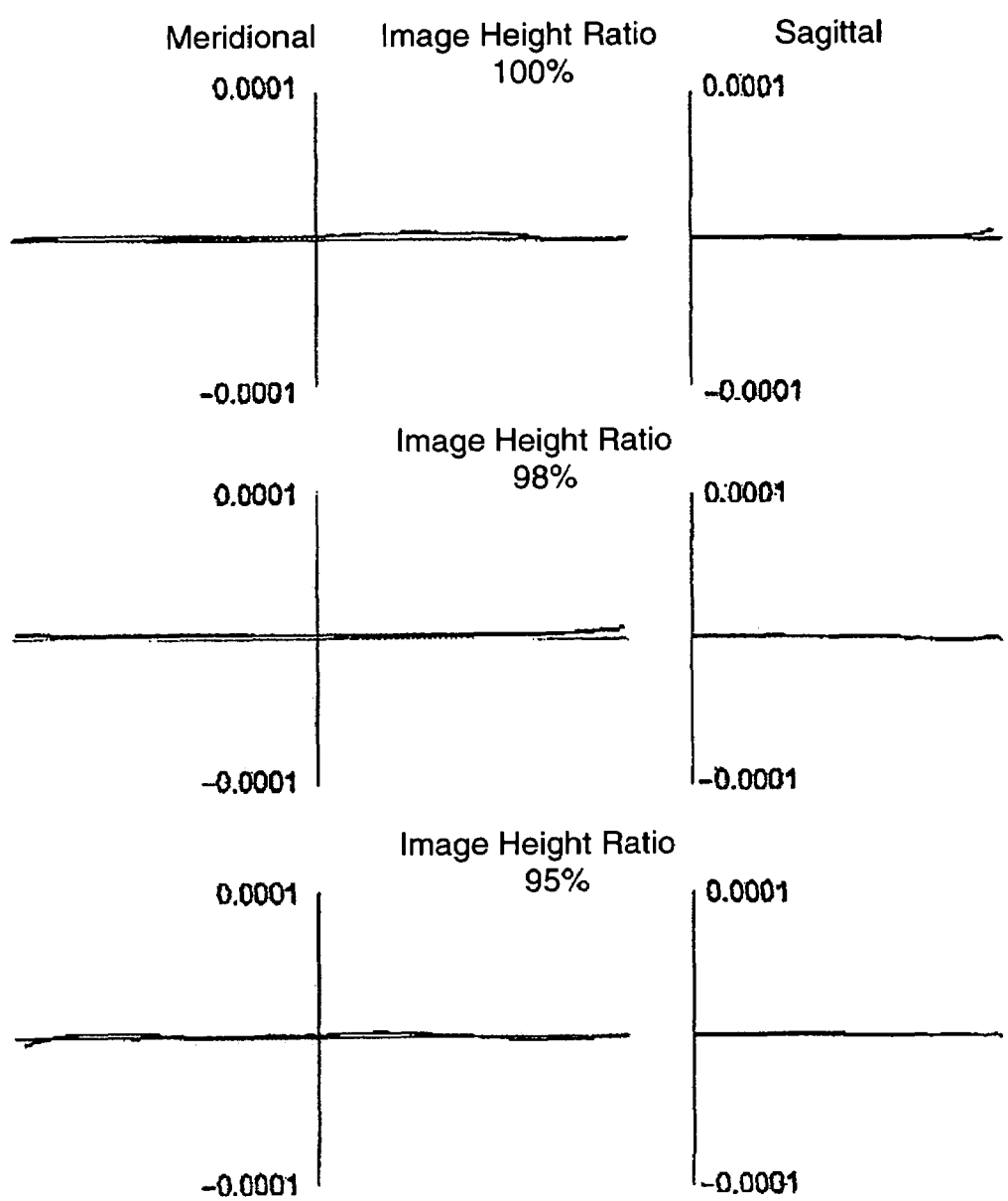
FIG. 8 is a drawing showing coma aberration in the projection optical system of the third embodiment.

FIG. 8 is a drawing showing coma aberration in the projection optical system of the third embodiment. In FIG. 8, the meridional coma aberration and sagittal coma aberration at image height 100%, image height 98%, and image height 95% are shown. As is clear from the aberration drawing, in the third embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 4

Figure 9:
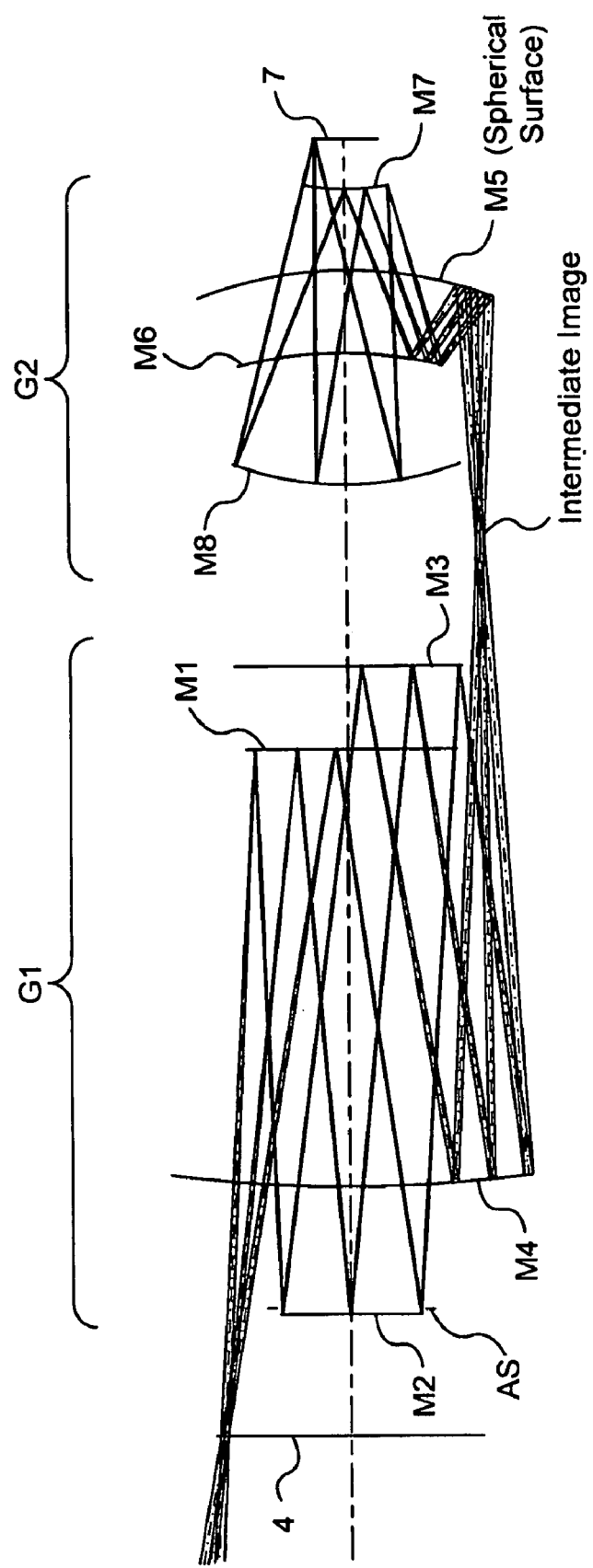
FIG. 9 is a drawing showing the configuration of the projection optical system of a fourth embodiment of the present invention.

FIG. 9 is a drawing showing the configuration of the projection optical system of a fourth embodiment of the present invention.

Referring to FIG. 9, in the projection optical system of the fourth embodiment, after the light from mask 4 is reflected sequentially by the concave reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed.

Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the concave fifth reflective mirror is composed of a spherical surface.

In the next Chart (4), the values of various factors of the projection optical system involved in the fourth embodiment are shown.

CHART 4

(Major Factors)

$\lambda$ = 13.5 nm
$\beta$ = ¼
NA = 0.25
H0 = 156 mm
$\phi$ = 40 mm
LX = 26 mm
LY = 2 mm (Optical Member Factors)

| Surface Number | r | d | Optical Member |
|---|---|---|---|
| S0 | (mask surface) | 781.95 | |
| S1 | −28805.85 | −661.95 | (first reflective mirror M1) |
| S2 | 1743.86 | 761.95 | (second reflective mirror M2) |
| S3 | 3637.96 | −631.50 | (third reflective mirror M3) |
| S4 | 2000.00 | 1158.09 | (fourth reflective mirror M4) |
| S5 | −515.87 | −100.00 | (fifth reflective mirror M5) spherical surface |
| S6 | −647.38 | 203.27 | (sixth reflective mirror M6) |
| S7 | 287.98 | −350.33 | (seventh reflective mirror M7) |
| S8 | 440.27 | 414.51 | (eighth reflective mirror M8) |
| | (wafer surface) | | |

(Aspheric Surface Data)

S1 Surface $\kappa$ = 0.00
A = −1.01007E−10   B = 3.95362E−15   C = −7.20224E−20   D = 1.60201E−24
E = −4.75389E−29   F = 7.32205E−34   G = 2.71057E−39   H = 0.00000E+00

S2 Surface $\kappa$ = 0.00
A = −5.33007E−11   B = 3.44289E−16   C = 7.65850E−21   D = −7.52411E−25
E = 1.09544E−28   F = −7.97740E−33   G = 2.37891E−37   H = 0.00000E+00

CHART 4-continued

S3 Surface

κ = 0.00
A = −7.60928E−10   B = 4.95409E−16   C = −3.84238E−21   D = 4.64869E−25
E = −1.44100E−29   F = 2.13256E−34   G = −9.00528E−40   H = 0.00000E+00

S4 Surface

κ = 0.00
A = −2.06765E−10   B = −8.80308E−16   C = 1.56045E−20   D = −4.41065E−25
E = 6.77042E−30    F = −5.78228E−35   G = 2.11007E−40   H = 0.00000E+00

S5 Surface

Spherical Surface

S6 Surface

κ = 0.00
A = −7.19381E−10   B = −1.88098E−14   C = 3.70991E−18   D = −3.29939E−22
E = 1.82185E−26    F = −5.71942E−31   G = 7.75005E−36   H = 0.00000E+00

S7 Surface

κ = 0.00
A = 1.06857E−08    B = 1.17184E−13    C = 3.48324E−17   D = −4.32361E−21
E = 1.73807E−24    F = −2.77947E−28   G = 1.07444E−32   H = 0.00000E+00

S8 Surface

κ = 0.00
A = 4.94751E−11    B = 2.43983E−16    C = 8.33827E−22   D = 1.62044E−26
E = −5.45757E−31   F = 1.27492E−35    G = −1.18273E−40  H = 0.00000E+00

(Values Corresponding to Conditional Expression)

Mφ = 448.34 (maximum at the fourth reflective mirror M4)
TT = 1576.0
Mφ/H0 = 2.87
TT/H0 = 10.10
d1 = 781.95 mm
d2 = 661.95 mm
d3 = 761.95 mm
d1/d2 = 1.18
d3/d2 = 1.15

Figure 10:
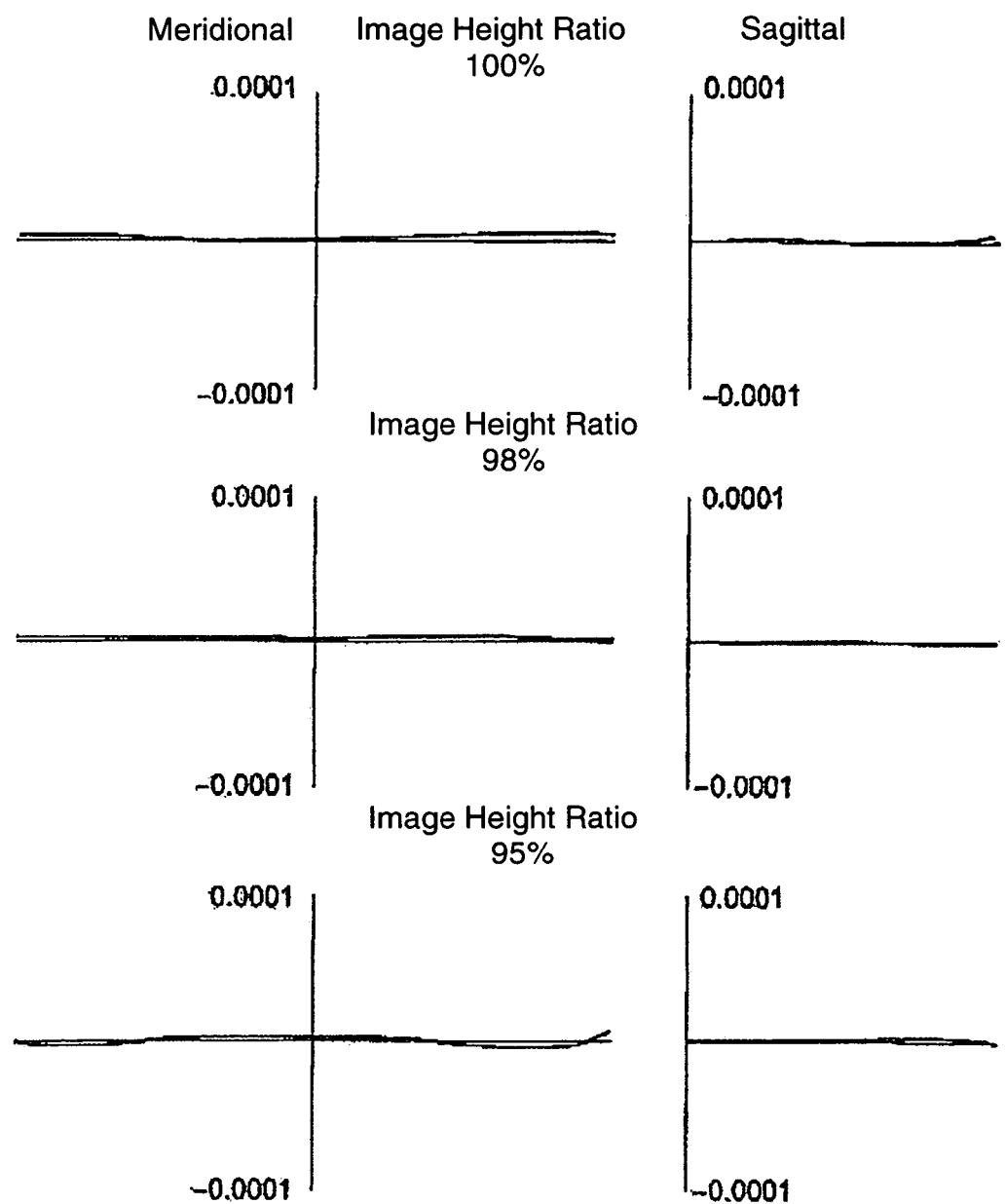
FIG. 10 is a drawing showing coma aberration in the projection optical system of the fourth embodiment.

FIG. 10 is a drawing showing coma aberration in the projection optical system of the fourth embodiment. In FIG. 10, the meridional coma aberration and sagittal coma aberration at image height 100%, image height 98%, and image height 95% are shown. As is clear from the aberration drawing, in the fourth embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 5

Figure 11:
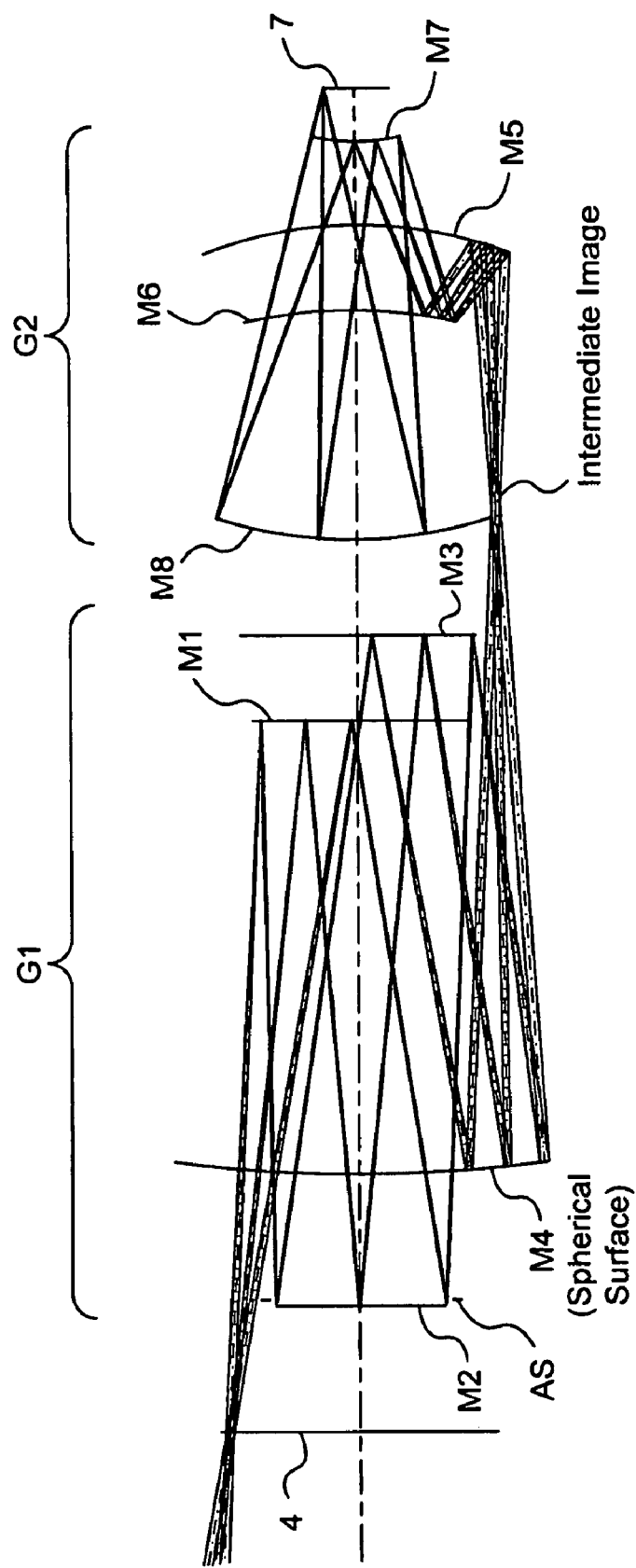
FIG. 11 is a drawing showing the configuration of the projection optical system of a fifth embodiment of the present invention.

FIG. 11 is a drawing showing the configuration of the projection optical system of a fifth embodiment of the present invention.

Referring to FIG. 11, in the projection optical system of the fifth embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the concave fourth reflective mirror is composed of a spherical surface.

In the next Chart (5), the values of various factors of the projection optical system involved in the fifth embodiment are shown.

CHART 5

(Major Factors)

λ = 13.5 nm
β = ¼
NA = 0.25

CHART 5-continued

H0 = 156 mm
φ = 40 mm
LX = 26 mm
LY = 2 mm

(Optical Member Factors)

| Surface Number | r | d | Optical Member |
|---|---|---|---|
| S0 | (mask surface) | 855.76 | |
| S1 | 8877.90 | −735.76 | (first reflective mirror M1) |
| S2 | 1582.90 | 879.63 | (second reflective mirror M2) |
| S3 | 1755.49 | −698.06 | (third reflective mirror M3) |
| S4 | 1761.63 | 1150.58 | (fourth reflective mirror M4) spherical surface |
| S5 | −759.00 | −100.00 | (fifth reflective mirror M5) |
| S6 | −2512.82 | 200.00 | (sixth reflective mirror M6) |
| S7 | 271.11 | −302.52 | (seventh reflective mirror M7) |
| S8 | 482.40 (wafer surface) | 450.37 | (eighth reflective mirror M8) |

(Aspheric Surface Data)

S1 Surface $\kappa = 0.00$
A = 4.86388E−10   B = 3.69294E−14   C = −2.40380E−18   D = 1.52251E−22
E = −7.12313E−27  F = 2.04697E−31   G = −2.69984E−36   H = 0.00000E+00

S2 Surface $\kappa = 0.00$
A = 5.50594E−11   B = −2.04768E−16   C = 3.01118E−20    D = −4.15366E−24
E = 3.30674E−28   F = −1.42210E−32   G = 2.54409E−37    H = 0.00000E+00

S3 Surface $\kappa = 0.00$
A = 3.18748E−11   B = −3.58792E−17   C = −7.44055E−20   D = 5.26232E−24
E = −2.36267E−28  F = 5.62019E−33    G = −5.28182E−38   H = 0.00000E+00

S4 Surface

Spherical Surface

S5 Surface $\kappa = 0.00$
A = 8.68542E−10   B = −7.07164E−14   C = 2.77451E−18    D = −1.09193E−22
E = 6.12882E−27   F = −1.98877E−31   G = 2.47385E−36    H = 0.00000E+00

S6 Surface $\kappa = 0.00$
A = 1.43537E−09   B = −1.82807E−13   C = 2.25287E−17    D = −7.06178E−22
E = −2.55617E−26  F = 2.50370E−30    G = −5.05416E−35   H = 0.00000E+00

S7 Surface $\kappa = 0.00$
A = 1.50565E−08   B = −3.37130E−12   C = 1.35006E−15    D = −5.19281E−19
E = 1.51018E−22   F = −2.69433E−26   G = 2.17856E−30    H = 0.00000E+00

S8 Surface $\kappa = 0.00$
A = 3.82947E−11   B = 2.26337E−16    C = 5.47822E−21    D = −3.00184E−25
E = 1.26429E−29   F = −2.74528E−34   G = 2.55201E−39    H = 0.00000E+00

(Values Corresponding to Conditional Expression)

Mφ = 517.35 (maximum at the fourth reflective mirror M4)
TT = 1600.0
Mφ/H0 = 3.32
TT/H0 = 10.26
d1 = 855.76 mm
d2 = 735.76 mm
d3 = 879.63 mm
d1/d2 = 1.16
d3/d2 = 1.20

Figure 12:
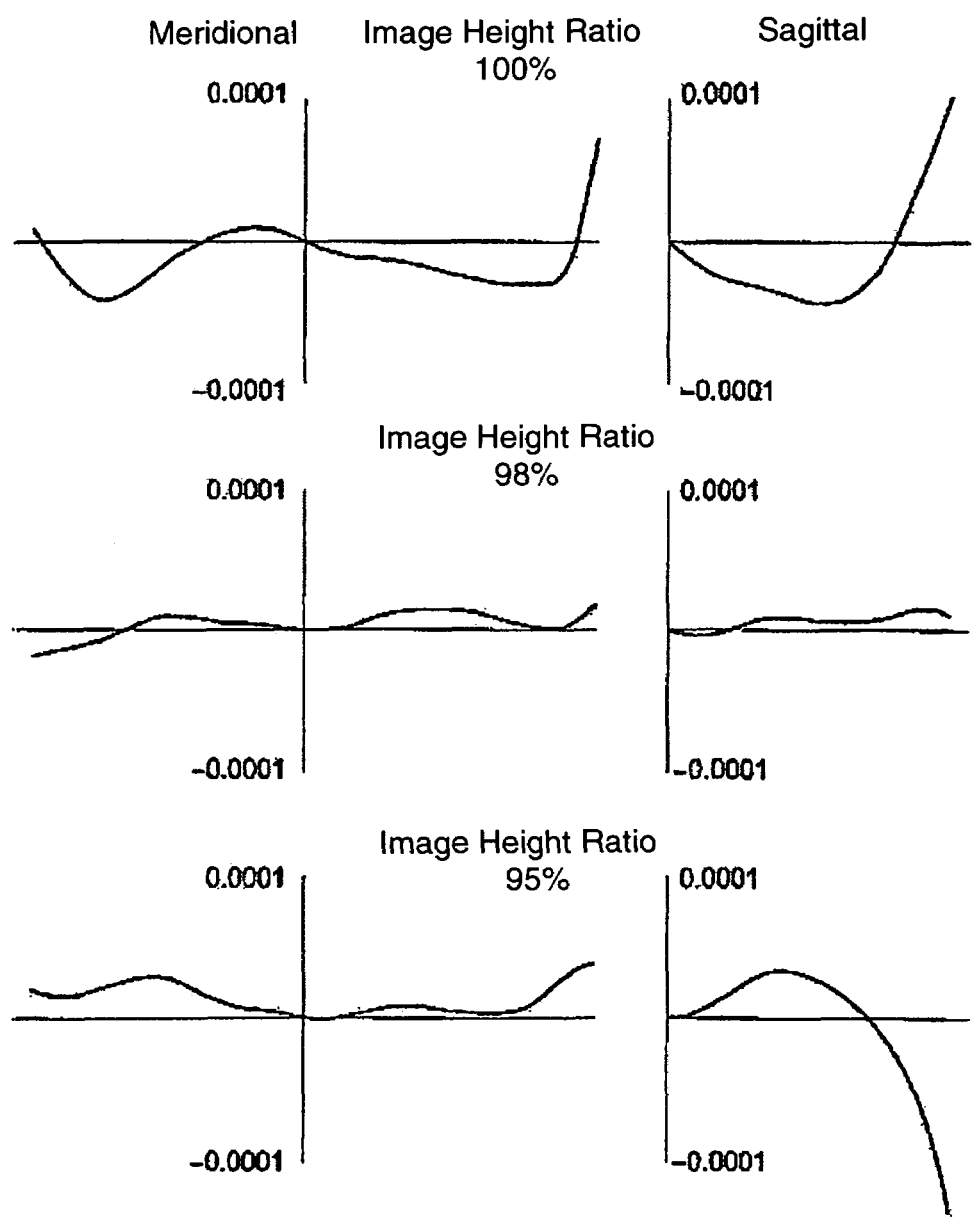
FIG. 12 is a drawing showing coma aberration in the projection optical system of the fifth embodiment.

FIG. 12 is a drawing showing coma aberration in the projection optical system of the fifth embodiment. In FIG. 12, the meridional coma aberration and sagittal coma aberration at image height 100%, image height 98%, and image height 95% are shown. As is clear from the aberration drawing, in the fifth embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 6

Figure 13:
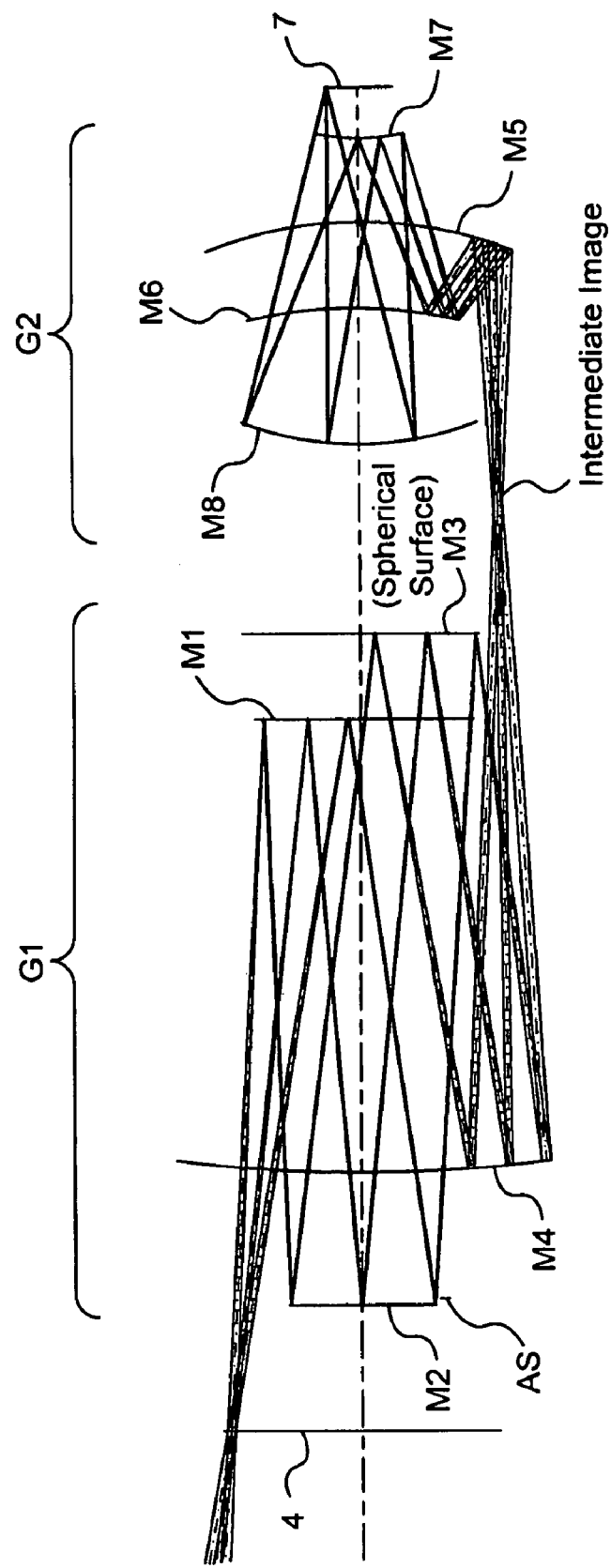
FIG. 13 is a drawing showing the configuration of the projection optical system of a sixth embodiment of the present invention.

FIG. 13 is a drawing showing the configuration of the projection optical system of a sixth embodiment of the present invention.

Referring to FIG. 13, in the projection optical system of the sixth embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the convex third reflective mirror is composed of a spherical surface.

In the next Chart (6), the values of various factors of the projection optical system involved in the sixth embodiment are shown.

CHART 6

(Major Factors)

$\lambda$ = 13.5 nm
$\beta$ = ¼
NA = 0.25
H0 = 156 mm
$\phi$ = 40 mm
LX = 26 mm
LY = 2 mm (Optical Member Factors)

| Surface Number | r | D | Optical Member |
|---|---|---|---|
| S0 | (mask surface) | 841.07 | |
| S1 | 11039.33 | −721.07 | (first reflective mirror M1) |
| S2 | 1617.82 | 821.07 | (second reflective mirror M2) |
| S3 | 2446.35 | −681.65 | (third reflective mirror M3) spherical surface |
| S4 | 2000.00 | 1187.31 | (fourth reflective mirror M4) |
| S5 | −482.49 | −100.00 | (fifth reflective mirror M5) |
| S6 | −501.73 | 200.00 | (sixth reflective mirror M6) |
| S7 | 340.68 | −254.38 | (seventh reflective mirror M7) |
| S8 | 443.92 | 407.65 | (eighth reflective mirror M8) |
| | (wafer surface) | | |

(Aspheric Surface Data)

S1 Surface $\kappa$ = 0.00
A = 5.52614E−11    B = 1.38370E−15    C = −3.84269E−20    D = 1.06804E−23
E = −6.53118E−28   F = 2.16069E−32    G = −3.23974E−37    H = 0.00000E+00

S2 Surface $\kappa$ = 0.00
A = −1.30598E−10   B = −8.72576E−16   C = −9.80597E−21    D = 9.76277E−25
E = −1.09433E−28   F = 6.36889E−33    G = −1.51086E−37    H = 0.00000E+00

S3 Surface

Spherical Surface

S4 Surface $\kappa$ = 0.00
A = −1.01599E−10   B = 6.19470E−16    C = −2.65958E−20    D = 6.01905E−25
E = −8.31396E−30   F = 6.43013E−35    G = −2.13455E−40    H = 0.00000E+00

S5 Surface $\kappa$ = 0.00
A = 6.90424E−10    B = −7.80937E−15   C = 2.02344E−18     D = −1.10078E−22
E = 2.96968E−27    F = −4.05905E−32   G = 2.25755E−37     H = 0.00000E+00

CHART 6-continued

S6 Surface

κ = 0.00
A = 4.38239E−09   B = 2.61724E−13   C = −3.24417E−17   D = 1.92286E−21
E = −5.33138E−26  F = 2.86023E−31   G = 1.03596E−35    H = 0.00000E+00

S7 Surface

κ = 0.00
A = 1.21470E−08   B = −8.57463E−14  C = 2.81447E−17    D = −5.11735E−20
E = 1.93974E−23   F = −4.27193E−27  G = 3.97324E−31    H = 0.00000E+00

S8 Surface

κ = 0.00
A = 2.47598E−10   B = 1.95136E−15   C = 1.44504E−20    D = −1.20985E−25
E = 1.74797E−29   F = −6.31416E−34  G = 9.33844E−39    H = 0.00000E+00

(Values Corresponding to Conditional Expression)

Mφ = 474.75 (maximum at the fourth reflective mirror M4)
TT = 1600.0
Mφ/H0 = 3.04
TT/H0 = 10.26
d1 = 841.07 mm
d2 = 721.07 mm
d3 = 821.07 mm
d1/d2 = 1.17
d3/d2 = 1.14

Figure 14:
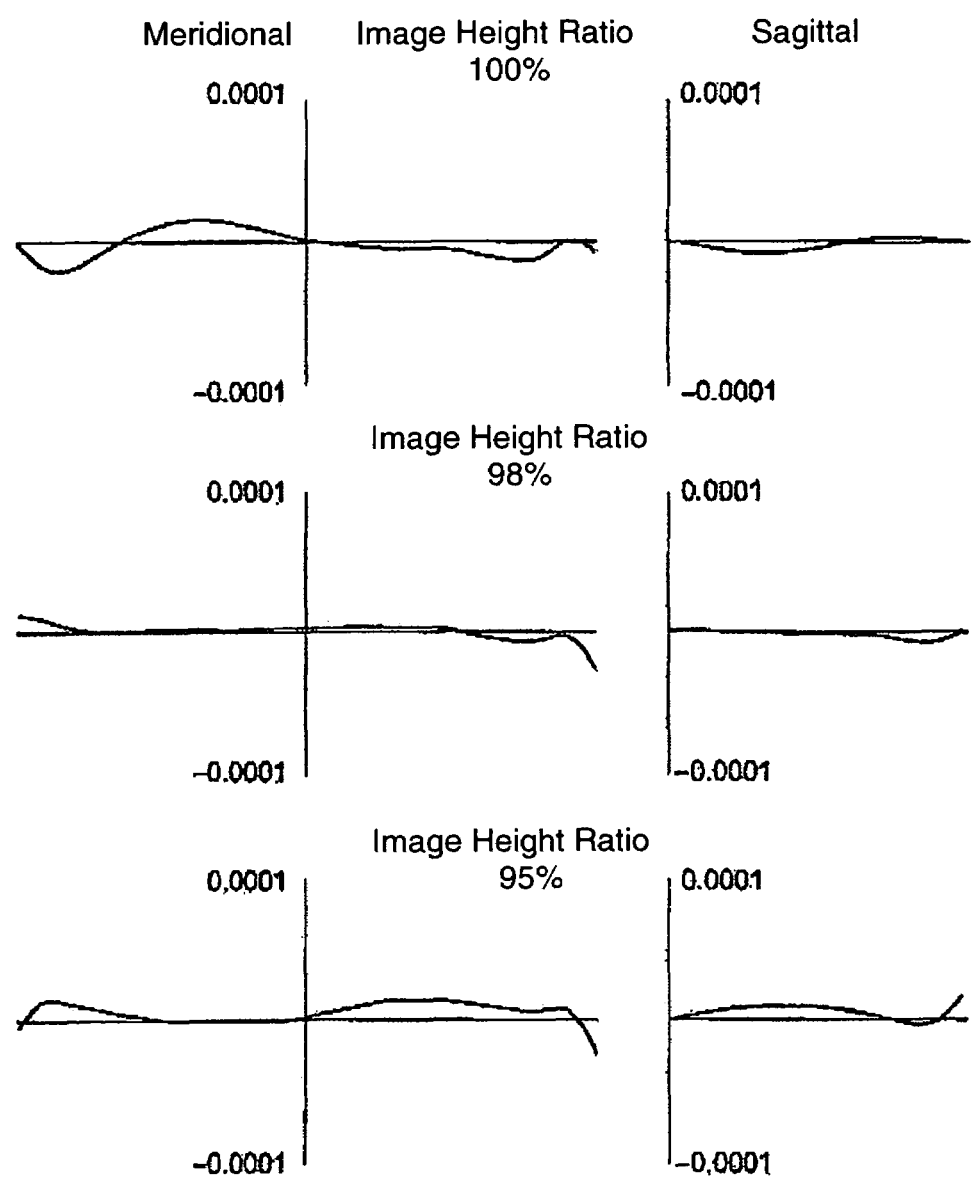
FIG. 14 is a drawing showing coma aberration in the projection optical system of the sixth embodiment.

FIG. 14 is a drawing showing coma aberration in the projection optical system of the sixth embodiment. In FIG. 14, the meridional coma aberration and sagittal coma aberration at image height 100%, image height 98%, and image height 95% are shown. As is clear from the aberration drawing, in the sixth embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 7

Figure 15:
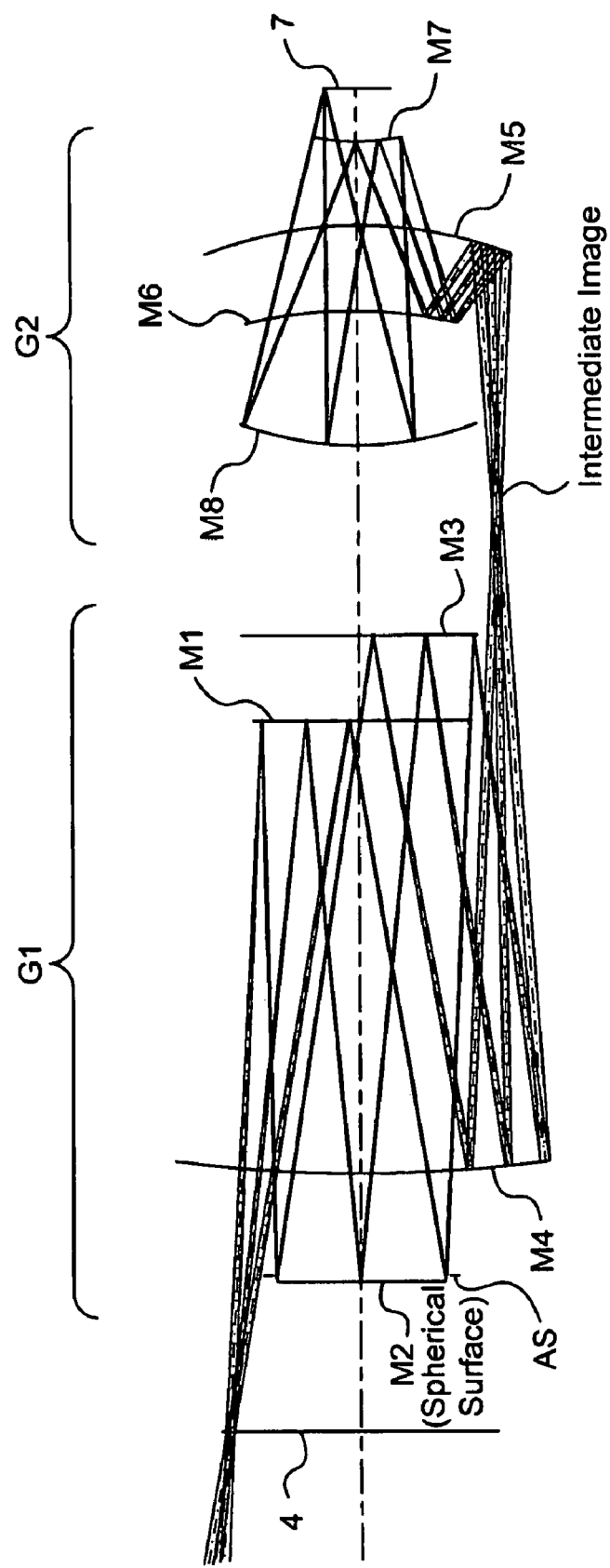
FIG. 15 is a drawing showing the configuration of the projection optical system of a seventh embodiment of the present invention.

FIG. 15 is a drawing showing the configuration of the projection optical system of a seventh embodiment of the present invention.

Referring to FIG. 15, in the projection optical system of the seventh embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the concave second reflective mirror is composed of a spherical surface.

In the next Chart (7), the values of various factors of the projection optical system involved in the seventh embodiment are shown.

CHART 7

(Major Factors)

λ = 13.5 nm
β = ¼
NA = 0.25
H0 = 156 mm
φ = 40 mm
LX = 26 mm
LY = 2 mm (Optical Member Factors)

| Surface Number | r | d | Optical Member |
|---|---|---|---|
| S0 | (mask surface) | 849.69 | |
| S1 | 23309.04 | −666.38 | (first reflective mirror M1) |

CHART 7-continued

| S2 | 1631.89 | 766.38 | (second reflective mirror M2) spherical surface |
| S3 | 2687.92 | −635.38 | (third reflective mirror M3) |
| S4 | 2000.00 | 1127.98 | (fourth reflective mirror M4) |
| S5 | −489.20 | −100.00 | (fifth reflective mirror M5) |
| S6 | −554.19 | 200.91 | (sixth reflective mirror M6) |
| S7 | 313.83 | −351.61 | (seventh reflective mirror M7) |
| S8 | 438.63 | 408.42 | (eighth reflective mirror M8) |
| (wafer surface) | | | |

(Aspheric Surface Data)

S1 Surface $\kappa = 0.00$
A = 1.50513E−10   B = 3.02143−15   C = −8.48835E−20   D = 9.97470E−25
E = 4.64062E−29   F = −2.41448E−33   G = 4.01984E−38   H = 0.00000E+00

S2 Surface

Spherical Surface

S3 Surface $\kappa = 0.00$
A = −8.67763E−10   B = 2.06507E−15   C = −1.85462E−21   D = −1.38609E−25
E = 4.28023E−30   F = −1.70964E−35   G = −1.08125E−39   H = 0.00000E+00

S4 Surface $\kappa = 0.00$
A = −2.18287E−10   B = −4.29107E−16   C = −1.91874E−21   D = 4.25004E−26
E = −9.81542E−31   F = 1.08197E−35   G = −4.80117E−41   H = 0.00000E+00

S5 Surface $\kappa = 0.00$
A = 3.57160E−10   B = −2.19811E−14   C = 2.36995E−18   D = −1.18488E−22
E = 3.30479E−27   F = −4.93170E−32   G = 3.07879E−37   H = 0.00000E+00

S6 Surface $\kappa = 0.00$
A = 1.33970E−09   B = 6.28995E−14   C = −8.12425E−18   D = 6.77538E−22
E = −3.39767E−26   F = 8.85578E−31   G = −8.43710E−36   H = 0.00000E+00

S7 Surface $\kappa = 0.00$
A = 9.12402E−09   B = −3.91177E−14   C = 3.59440E−17   D = 1.60493E−21
E = −1.40212E−24   F = 2.26670E−28   G = −1.47719E−32   H = 0.00000E+00

S8 Surface $\kappa = 0.00$
A = 1.33040E−11   B = 2.74191E−16   C = 1.69281E−21   D = 2.77234E−26
E = −9.88835E−31   F = 3.54065E−35   G = −4.92892E−40   H = 0.00000E+00

(Values Corresponding to Conditional Expression)

M$\phi$ = 436.43 (maximum at the fourth reflective mirror M4)
TT = 1600.0
M$\phi$/H0 = 3.04
TT/H0 = 10.26
d1 = 849.69 mm
d2 = 666.38 mm
d3 = 766.38 mm
d1/d2 = 1.28
d3/d2 = 1.15

Figure 16:
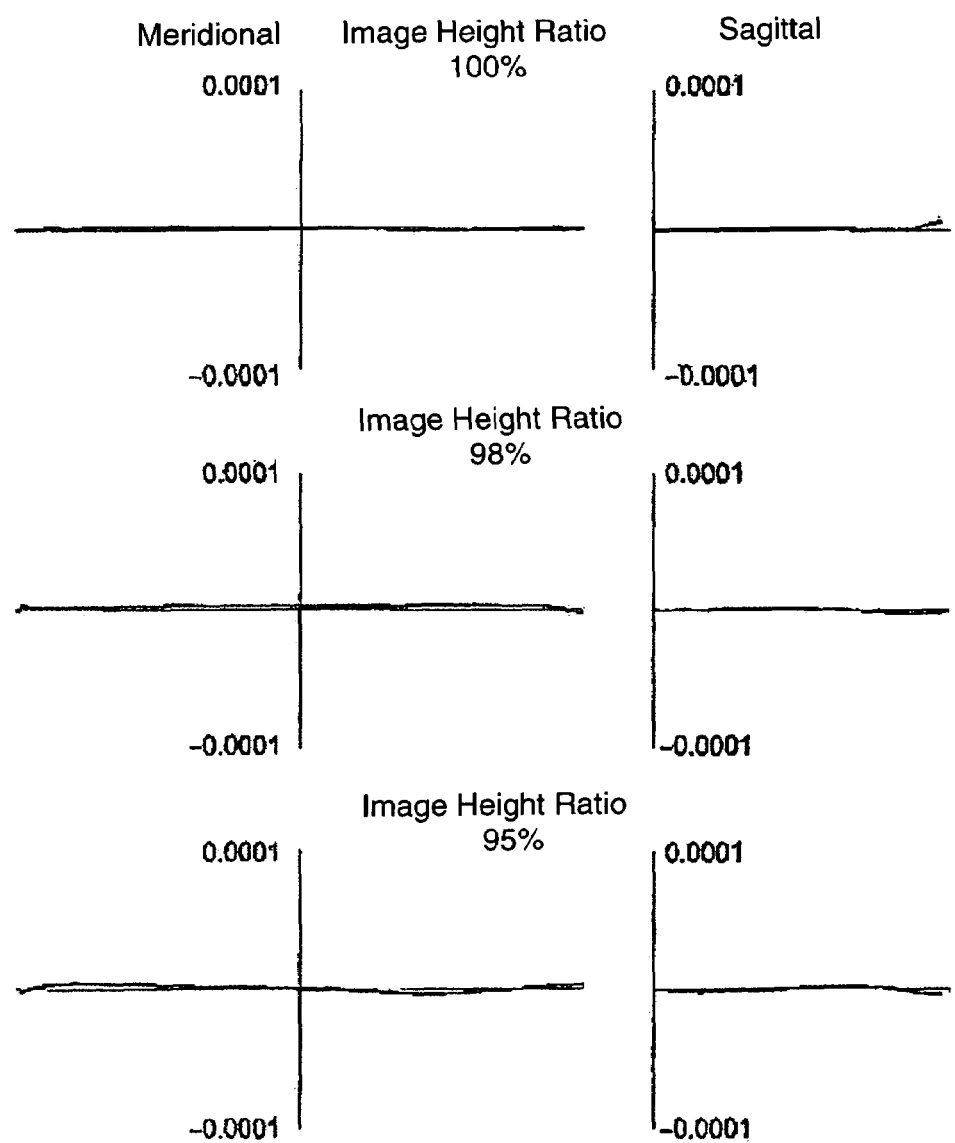
FIG. 16 is a drawing showing coma aberration in the projection optical system of the seventh embodiment.

FIG. 16 is a drawing showing coma aberration in the projection optical system of the seventh embodiment. In FIG. 16, the meridional coma aberration and sagittal coma aberration at image height 100%, image height 98%, and image height 95% are shown. As is clear from the aberration drawing, in the seventh embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 8

Figure 17:
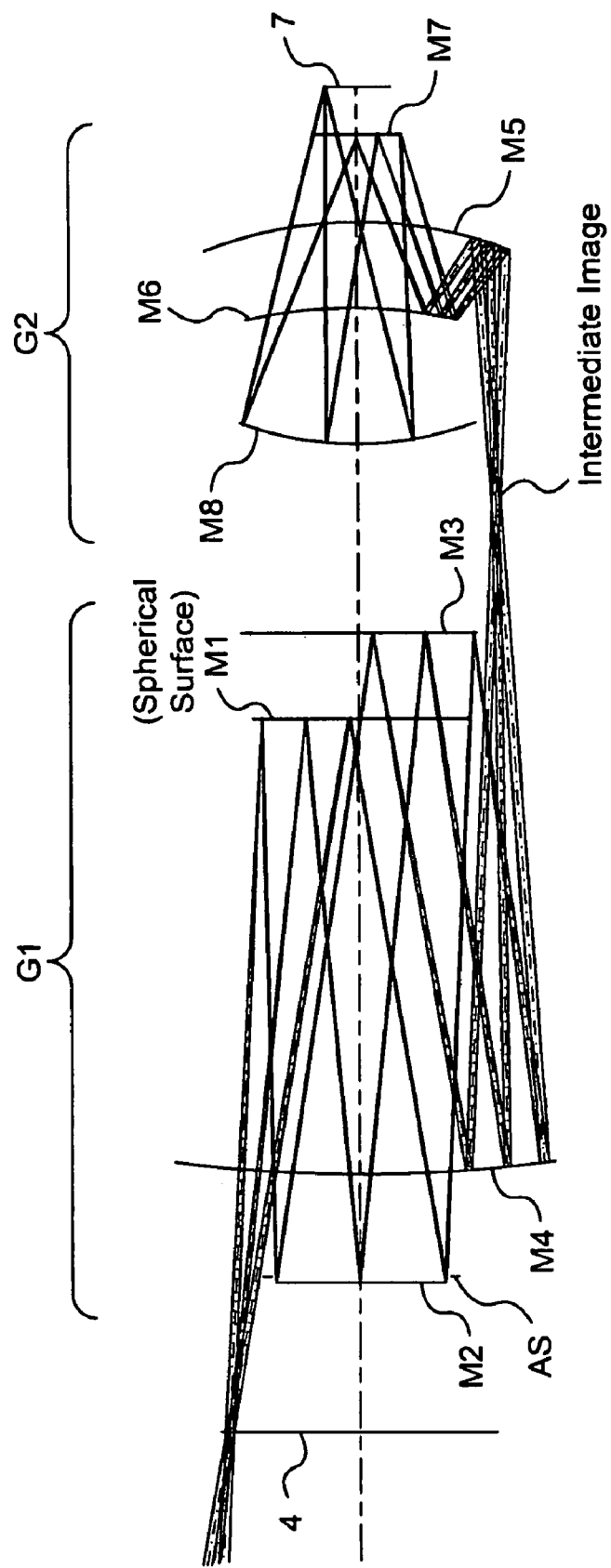
FIG. 17 is a drawing showing the configuration of the projection optical system of an eighth embodiment of the present invention.

FIG. 17 is a drawing showing the configuration of the projection optical system of an eighth embodiment of the present invention.

Referring to FIG. 17, in the projection optical system of the eighth embodiment, after the light from mask 4 is reflected sequentially by the convex reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the convex reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment, the eighth reflective mirror is composed of a spherical surface, but in the present embodiment the first reflective mirror is composed of a spherical surface.

In the next Chart (8), the values of various factors of the projection optical system involved in the eighth embodiment are shown.

CHART 8

(Major Factors)

$\lambda = 13.5$ nm
$\beta = \frac{1}{4}$
NA = 0.25
H0 = 156 mm
$\phi = 40$ mm
LX = 26 mm
LY = 2 mm (Optical Member Factors)

| Surface Number | r | d | Optical Member |
|---|---|---|---|
| S0 | (mask surface) | 849.86 | |
| S1 | 14647.57 | −695.37 | (first reflective mirror M1) spherical surface |
| S2 | 1624.30 | 795.37 | (second reflective mirror M2) |
| S3 | 2500.57 | −648.57 | (third reflective mirror M3) |
| S4 | 1959.70 | 1137.61 | (fourth reflective mirror M4) |
| S5 | −518.59 | −100.36 | (fifth reflective mirror M5) |
| S6 | −652.55 | 201.53 | (sixth reflective mirror M6) |
| S7 | 305.01 | −355.04 | (seventh reflective mirror M7) |
| S8 | 443.86 (wafer surface) | 414.98 | (eighth reflective mirror M8) |

(Aspheric Surface Data)

S1 Surface

Spherical Surface

S2 Surface $\kappa = 0.00$
A = −6.19961E−11   B = −8.01064E−17   C = 7.39785E−22   D = −1.63635E−25
E = 1.61146E−29    F = −7.76550E−34   G = 1.41983E−38   H = 0.00000E+00

S3 Surface $\kappa = 0.00$
A = −6.12122E−10   B = −1.16001E−16   C = 8.10748E−21   D = −5.70065E−25
E = 2.95099E−29    F = −7.54162E−34   G = 7.55756E−39   H = 0.00000E+00

S4 Surface $\kappa = 0.00$
A = −1.76221E−10   B = −3.50361E−16   C = −1.35172E−21  D = 3.31221E−26
E = −8.84773E−31   F = 1.02240E−35    G = −4.59915E−41  H = 0.00000E+00

S5 Surface $\kappa = 0.00$
A = 2.45960E−10    B = −2.33020E−14   C = 2.50729E−18   D = −1.26602E−22
E = 3.52881E−27    F = −5.24219E−32   G = 3.24672E−37   H = 0.00000E+00

S6 Surface $\kappa = 0.00$
A = 6.48337E−10    B = 3.87553E−14    C = −3.35305E−18  D = 6.90509E−23
E = 7.76879E−27    F = −5.95487E−31   G = 1.27029E−35   H = 0.00000E+00

S7 Surface $\kappa = 0.00$
A = 1.05474E−08    B = 3.44948E−13    C = 1.44739E−17   D = −3.88657E−21
E = 2.06264E−24    F = −5.25423E−28   G = 5.65376E−32   H = 0.00000E+00

CHART 8-continued

S8 Surface

κ = 0.00
A = 8.95479E−11    B = 5.33820E−16    C = 2.52317E−21    D = 2.95882E−26
E = −7.88338E−32   F = −6.29084E−36   G = 1.64811E−40    H = 0.00000E+00

(Values Corresponding to Conditional Expression)

Mφ = 448.25 (maximum at the fourth reflective mirror M4)
TT = 1600.0
Mφ/H0 = 2.87
TT/H0 = 10.26
d1 = 849.86 mm
d2 = 695.37 mm
d3 = 795.37 mm
d1/d2 = 1.22
d3/d2 = 1.14

Figure 18:
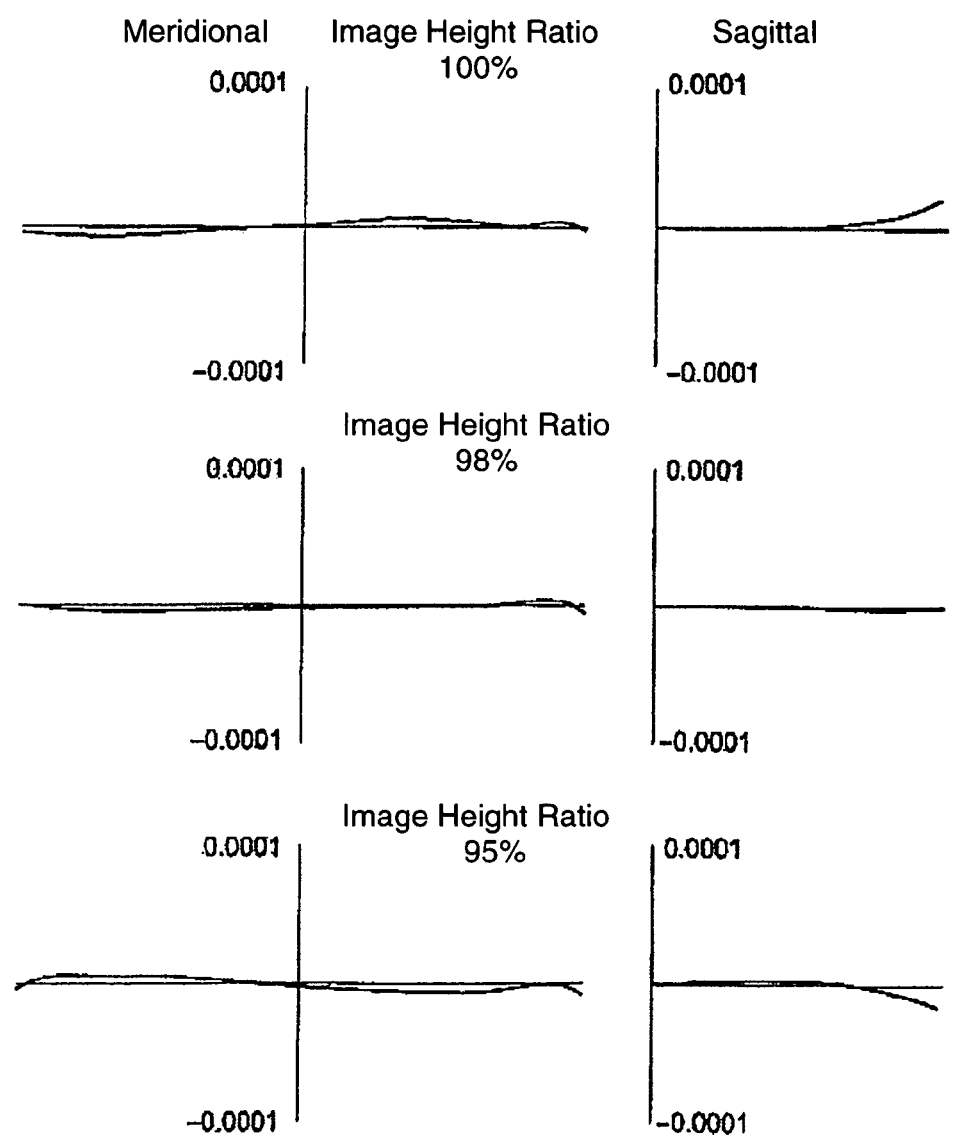
FIG. 18 is a drawing showing coma aberration in the projection optical system of the eighth embodiment.

FIG. 18 is a drawing showing coma aberration in the projection optical system of the eighth embodiment. In FIG. 18, the meridional coma aberration and sagittal coma aberration at image height 100%, image height 98%, and image height 95% are shown. As is clear from the aberration drawing, in the eighth embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Embodiment 9

Figure 19:
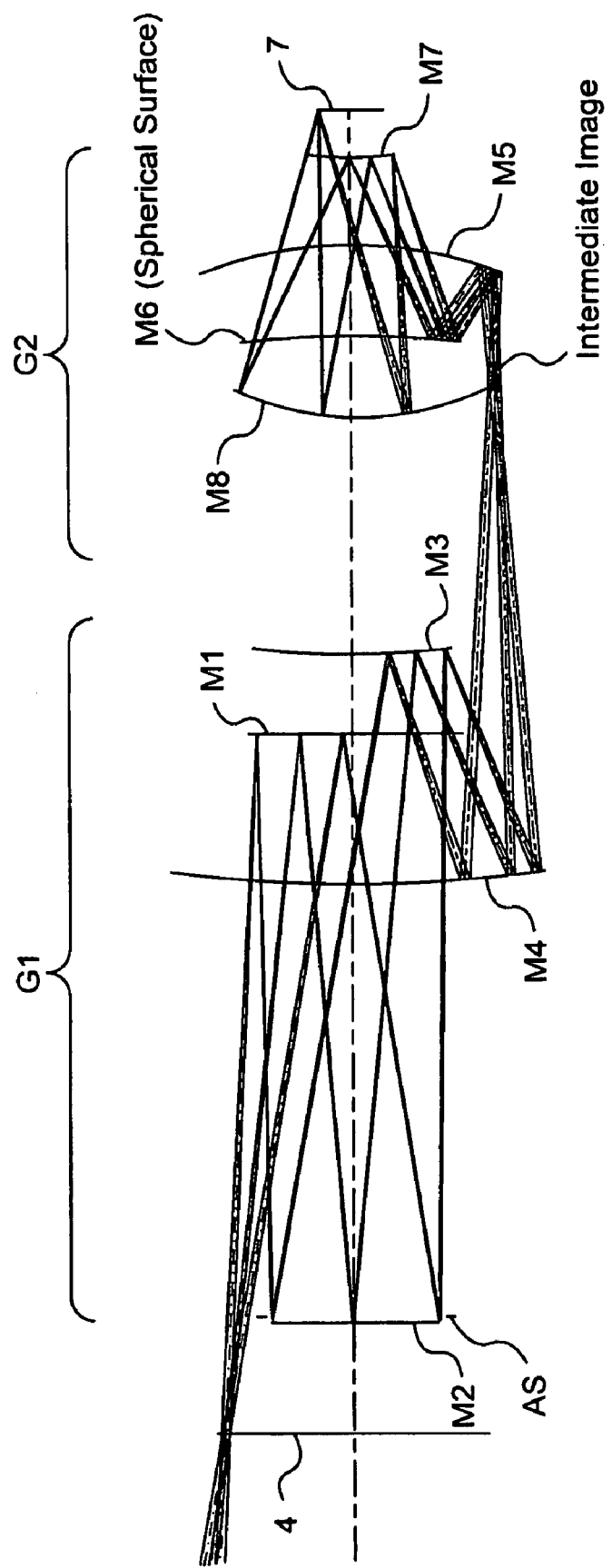
FIG. 19 is a drawing showing the configuration of the projection optical system of a ninth embodiment of the present invention.

FIG. 19 is a drawing showing the configuration of the projection optical system of a ninth embodiment of the present invention.

Referring to FIG. 19, in the projection optical system of the ninth embodiment, after the light from mask 4 is reflected sequentially by the concave reflective surface of the first reflective mirror M1, the concave reflective surface of the second reflective mirror M2, the convex reflective surface of the third reflective mirror M3, and the concave reflective surface of the fourth reflective mirror M4; an intermediate image of the mask pattern is formed. Then, after the light from the intermediate image of the mask pattern formed via the first reflective imaging optical system G1 is reflected sequentially by the concave reflective surface of the fifth reflective mirror M5, the concave reflective surface of the sixth reflective mirror M6, the convex reflective surface of the seventh reflective mirror M7, and the concave reflective surface of the eighth reflective mirror M8, a reduced image of the mask pattern (secondary image) is formed on wafer 7. In the projection optical system of the first embodiment the eighth reflective mirror is composed of a spherical surface, but in the present embodiment the convex sixth reflective mirror is composed of a spherical surface.

In the next Chart (9), the values of various factors of the projection optical system involved in the ninth embodiment are shown.

CHART 9

(Major Factors)

λ = 13.5 nm
β = ¼
NA = 0.35
H0 = 156 mm
φ = 40 mm
LX = 26 mm
LY = 2 mm (Optical Member Factors)

| Surface Number | r | d | Optical Member |
|---|---|---|---|
| S0 | (mask surface) | 709.93 | |
| S1 | −4433.41 | −589.93 | (first reflective mirror M1) |
| S2 | 1327.91 | 689.93 | (second reflective mirror M2) |
| S3 | 677.63 | −268.10 | (third reflective mirror M3) |
| S4 | 891.30 | 805.69 | (fourth reflective mirror M4) |
| S5 | −978.07 | −123.10 | (fifth reflective mirror M5) |
| S6 | 24591.30 | 235.57 | (sixth reflective mirror M6) spherical surface |
| S7 | 237.26 | −335.57 | (seventh reflective mirror M7) |

CHART 9-continued

| S8 | 404.70 (wafer surface) | 375.57 | (eighth reflective mirror M8) |

(Aspheric Surface Data)

S1 Surface

κ = 0.00
A = 1.37230E−09   B = −2.34495E−14   C = 3.54540E−19   D = −4.91321E−24
E = 1.12584E−28   F = −3.55914E−33   G = 5.08482E−38   H = 0.00000E+00

S2 Surface

κ = 0.00
A = −7.38075E−11   B = −1.87124E−16   C = −5.25573E−20   D = 9.80006E−24
E = −1.03334E−27   F = 5.88491E−32    G = −1.37947E−36   H = 0.00000E+00

S3 Surface

κ = 0.00
A = −2.65468E−09   B = −2.02936E−15   C = 1.51722E−19   D = −1.06845E−23
E = 3.88202E−28    F = −9.62486E−33   G = 1.1336E−37    H = 0.00000E+00

S4 Surface

κ = 0.00
A = −2.71226E−10   B = −3.34206E−15   C = 8.03920E−20   D = −1.68936E−24
E = 2.12370E−29    F = −1.50533E−34   G = 4.47804E−40   H = 0.00000E+00

S5 Surface

κ = 0.00
A = 3.78564E−10    B = −2.98239E−14   C = 3.02836E−19   D = 2.29877E−23
E = −9.76811E−28   F = 1.56167E−32    G = −9.39373E−38  H = 0.00000E+00

S6 Surface

Spherical Surface
S7 Surface

κ = 0.00
A = −4.86887E−09   B = 2.32977E−12    C = −2.42965E−17   D = 1.78170E−20
E = −1.18048E−23   F = 3.22917E−27    G = −3.03495E−31   H = 0.00000E+00

S8 Surface

κ = 0.00
A = 9.65841E−11    B = 7.68361E−16    C = 3.95891E−21    D = 2.59918E−26
E = 2.07120E−30    F = −7.39442E−3    G = 9.08142E−40    H = 0.00000E+00

(Values Corresponding to Conditional Expression)

Mφ = 488.42 maximum at the fourth reflective mirror M4)
TT = 1600.0
Mφ/H0 = 2.87
TT/H0 = 10.26
d1 = 709.93 mm
d2 = 589.93 mm
d3 = 689.93 mm
d1/d2 = 1.20
d3/d2 = 1.17

Figure 20:
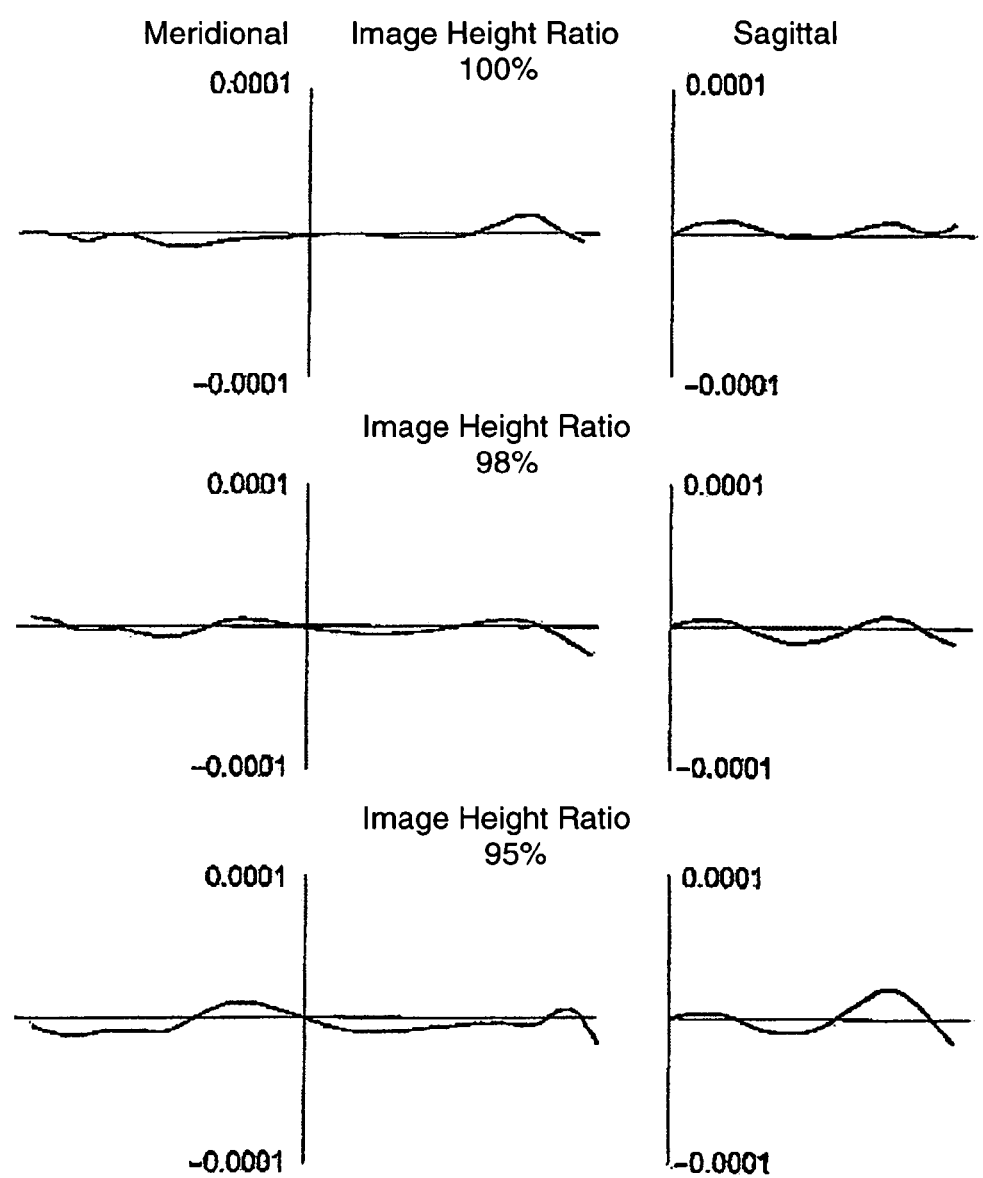
FIG. 20 is a drawing showing coma aberration in the projection optical system of the ninth embodiment.

FIG. 20 is a drawing showing coma aberration in the projection optical system of the ninth embodiment. In FIG. 20, the meridional coma aberration and sagittal coma aberration at image height 100%, image height 98%, and image height 95% are shown. As is clear from the aberration drawing, in the ninth embodiment, in the region corresponding to the effective imaging region ER, it can be seen that coma aberration is adequately corrected. Also, although omitted from the drawing, in the region corresponding to the effective imaging region ER, the fact that aberration other than coma aberration, for example spherical aberration and distortion and the like are adequately corrected is confirmed.

Per the above, in each of the embodiments described above, along with maintaining an image-side numerical aperture of 0.25~0.35 for laser plasma X-rays of 13.5 nm wavelength, an arc-shaped effective exposure region of 26 mm×2 mm in which aberrations can be adequately corrected can be maintained on wafer 7. Accordingly, on wafer 7, it is possible to transfer the pattern of mask 4 at a resolution of 0.1 μm or less by means of scanning exposure to in each exposure region having a size of 26 mm×66 mm for example.

Also, in each of the above embodiments, the effective diameter of the largest reflective mirror M4 is about 400~520 mm, which is sufficiently suppressed. In this way, size increase of the reflective mirrors can be suppressed, leading to miniaturization of the optical system. Also, in the present invention, the distance TT from the object (reticle) to the image (wafer) (distance between object and image) stays within 1350 mm~1800 mm, thus optical properties can be adequately maintained while limiting increase in size of the optical system.

In addition, in an exposure apparatus involved in the above embodiments, by making the fifth reflective mirror M5 or sixth reflective mirror M6, mirrors with relatively small effective regions, in a spherical shape, it becomes possible to manufacture a highly precise reflective optical system easily. Also, in the exposure apparatus involved in the above embodiments, by making the sixth reflective mirror M6 or seventh reflective mirror M7, mirrors with relatively large light beam angles of incidence, in a spherical shape, it becomes possible to manufacture a highly precise reflective optical system easily.

In the exposure apparatus involved in the above embodiments, by illuminating the mask by an illumination system (illumination process) and exposing a transfer pattern formed on the mask onto a photosensitive substrate using a projection optical system (exposure process), it is possible to manufacture a microdevice (semiconductor element, imaging element, liquid crystal display element, thin film magnetic head, etc.). Below we will explain, with reference to the flowchart of FIG. 21, an example of a technique for obtaining a semiconductor device as a microdevice by forming a specific circuit pattern on a wafer serving as a photosensitive substrate using an exposure apparatus of the present embodiment.

Figure 21:
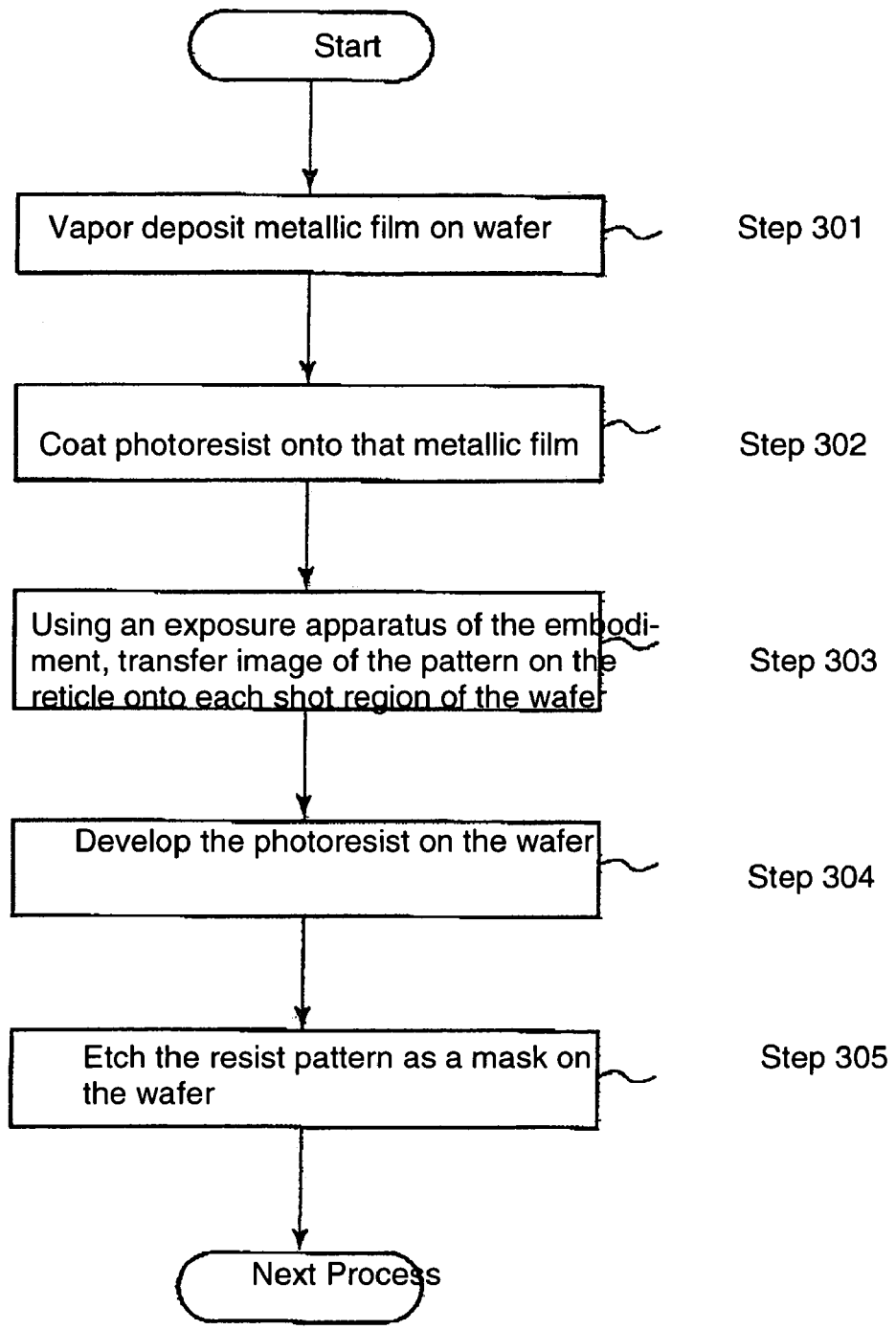
FIG. 21 is a drawing showing a flow chart for an example of a technique for obtaining a semiconductor device as a microdevice.

First, in step 301 of FIG. 21, a metallic film is vapor deposited onto one lot of wafers. In the next step 302, photoresist is coated onto the metallic film on that one lot of wafers. After that, in step 303, an image of the pattern on the mask (reticle) is exposure transferred in sequence onto each shot region of that one lot of wafers using the exposure apparatus of the present embodiment via the projection optical system thereof.

After that, in step 304, after the photoresist on the one lot of wafers is developed, in step 305 the circuit pattern corresponding to the pattern on the mask is formed on each shot region of each wafer by means of etching a resist pattern on the one lot of wafers as a mask. Afterward, by forming another layer of circuit pattern on top, a device such as a semiconductor element is manufactured. By means of the above semiconductor device manufacturing method, a semiconductor device having an extremely minute circuit pattern can be obtained with good throughput.

Note that in the above present embodiment, a laser plasma X-ray source is used as a light source for supplying X-rays, but it is not limited to this; it is also possible to use synchrotron radiation light (SOR) as X-rays, for example.

Also, in the above present embodiment, the present invention is applied to an exposure apparatus having a light source for supplying X-rays, but it is not limited to this; the present invention can be applied to an exposure device having a light source that supplies light of wavelengths other than X-rays.

Furthermore, in the above present embodiment, the present invention is applied to the projection optical system of an exposure apparatus, but it is not limited to this; the present invention can be applied to other general projection optical systems as well.

The invention claimed is:

1. A reflective-type projection optical system for forming a reduced image of a first surface on a second surface, the optical system comprising:
a first reflective imaging optical system for forming an intermediate image of the first surface and a second reflective imaging optical system for forming an image of the intermediate image on the second surface;
the first reflective imaging optical system comprising, from the first surface side in order of light beam incidence, a first reflective mirror, a second reflective mirror, a third reflective mirror, and a fourth reflective mirror;
the second reflective imaging optical system comprising, from the first surface side in order of light beam incidence, a fifth reflective mirror, a sixth reflective mirror, a seventh reflective mirror, and an eighth reflective mirror, and
at least one of the reflective surfaces of the reflective mirrors being configured as a spherical surface, and the remaining reflective surfaces of the mirrors being configured as aspheric surfaces,
wherein the following condition is satisfied:

$$8 < TT/H0 < 15$$

when the axial interval between the first surface and the second surface is TT and the maximum object height on the first surface is H0.

2. The reflective-type projection optical system described in claim 1, wherein, the distance from the first surface to the first reflective mirror is less than or equal to 700 mm.

3. The reflective-type projection optical system described in claim 1, wherein, the distance from the first reflective mirror to the second reflective mirror is less than or equal to 450 mm.

4. The reflective-type projection optical system described in claim 1, wherein the distance from the second reflective mirror to the third reflective mirror is less than or equal to 570 mm.

5. The reflective-type projection optical system described in claim 1, wherein the position of the second reflective mirror satisfies the following condition:

$$1 < d1/d2 < 1.9$$

when d1 is the distance from the first surface to the first reflective mirror, and d2 is the distance from the first reflective mirror to the second reflective mirror.

6. The reflective-type projection optical system described in claim 5, wherein the position of the third reflective mirror satisfies the following condition:

$$1 < d3/d2 < 1.5$$

when d2 is the distance from the first reflective mirror to the second reflective mirror, and
d3 is the distance from the second reflective mirror to the third reflective mirror.

7. The reflective-type projection optical system described in claim 6, wherein the reflective mirrors satisfy the following condition:

$$400 \text{ mm} < M\phi < 600 \text{ mm}$$

when the maximum effective diameter of each of the reflective mirrors is Mφ.

8. The reflective-type projection optical system described in claim 5, wherein the following condition:

$$2 < M\phi/H0 < 4$$

is satisfied when the maximum effective diameter of each of the reflective mirrors is Mφ and the maximum object height on the first surface is H0.

9. The reflective-type projection optical system described in claim 5, wherein the following condition:

$$1350 \text{ mm} < TT < 1800 \text{ mm}$$

is satisfied when the axial interval between the first surface and the second surface is TT.

10. The reflective-type projection optical system described in claim 5, wherein the image-side numerical aperture is at least 0.20 or greater.

11. An exposure apparatus comprising:
an illumination system for illuminating a pattern set on the first surface and the reflective-type projection optical system described in claim 1, for exposing the pattern onto a photosensitive substrate set on the second surface.

12. The exposure apparatus described in claim 11, wherein the illumination system has a light source configured to supply X-rays as the exposure light, and further comprising:

a mask stage which holds the first surface and moves the first surface relative to the reflective-type projection optical system; and a substrate stage which holds the photosensitive substrate and moves the photosensitive substrate relative to the reflective-type projection optical system.

13. A device manufacturing method comprising:

exposing the pattern onto the photosensitive substrate with the exposure apparatus according to claim 11;

developing the exposed pattern on the photosensitive substrate; and processing the developed photosensitive substrate.

* * * * *